(12) United States Patent
Sekiguchi et al.

(10) Patent No.: US 10,330,736 B2
(45) Date of Patent: Jun. 25, 2019

(54) SEMICONDUCTOR DEVICE, BATTERY MONITORING SYSTEM, AND DIAGNOSTIC METHOD FOR SEMICONDUCTOR DEVICE

(71) Applicant: LAPIS Semiconductor Co., Ltd., Yokohama (JP)

(72) Inventors: Masaru Sekiguchi, Yokohama (JP); Hidekazu Kikuchi, Yokohama (JP); Naoaki Sugimura, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 181 days.

(21) Appl. No.: 15/384,413

(22) Filed: Dec. 20, 2016

(65) Prior Publication Data
US 2017/0184678 A1 Jun. 29, 2017

(30) Foreign Application Priority Data
Dec. 28, 2015 (JP) .................................. 2015-256910

(51) Int. Cl.
| | | |
|---|---|---|
| *G01R 31/36* | (2019.01) | |
| *G01R 35/00* | (2006.01) | |
| *G01R 31/385* | (2019.01) | |
| *G01R 31/396* | (2019.01) | |
| *G01R 31/3832* | (2019.01) | |

(52) U.S. Cl.
CPC ........... *G01R 31/385* (2019.01); *G01R 31/36* (2013.01); *G01R 31/396* (2019.01); *G01R 35/00* (2013.01); *G01R 31/3833* (2019.01)

(58) Field of Classification Search
CPC .... G01R 31/00; G01R 31/36; G01R 31/3627; G01R 31/3658; G01R 35/00; G01R 31/383; G01R 31/385; G01R 31/396; G01N 27/00; G01N 27/26; G01N 27/416; G01N 35/00
USPC ................................................. 324/425, 426
See application file for complete search history.

(56) References Cited

U.S. PATENT DOCUMENTS

| | | | | |
|---|---|---|---|---|
| 6,304,088 | B1 * | 10/2001 | Yee ........................ | G01R 15/04 324/433 |
| 2003/0223271 | A1 * | 12/2003 | Byeon .................... | G11C 5/147 365/185.18 |
| 2010/0026308 | A1 * | 2/2010 | Jeon .................... | G01R 31/3658 324/429 |
| 2014/0239966 | A1 * | 8/2014 | Song .................. | G01R 31/3658 324/434 |

FOREIGN PATENT DOCUMENTS

| | | |
|---|---|---|
| JP | 2013-185904 A | 9/2013 |
| JP | 2015-156793 A | 8/2015 |

* cited by examiner

*Primary Examiner* — Hoai-An D. Nguyen
(74) *Attorney, Agent, or Firm* — Rabin & Berdo, P.C.

(57) ABSTRACT

A semiconductor device for measuring a voltage of a battery cell, including first and second nodes, and first and second battery voltage measurement units. The first node is configured to receive a first voltage, the first voltage being a voltage of a capacitor that accumulates an electric charge based on the voltage of the battery cell. The first battery voltage measurement unit measures the first voltage through a first path. The second node is configured to receive a second voltage based on the voltage of the battery cell, the second node being different from the first node. The second battery voltage measurement unit measures the second voltage through a second path that is different from the first path.

11 Claims, 20 Drawing Sheets

BATTERY MONITORING SYSTEM 1

SEMICONDUCTOR DEVICE, BATTERY MONITORING SYSTEM, AND DIAGNOSTIC METHOD FOR SEMICONDUCTOR DEVICE

BACKGROUND OF THE INVENTION

Technical Field

The present invention relates to a semiconductor device, a battery monitoring system, and a diagnostic method for a semiconductor device.

Background Art

In general, batteries in which a plurality of battery cells are connected in series are in use. Battery monitoring systems are known in which the voltage of battery cells of the battery is monitored and controlled by a semiconductor device for battery voltage measurement.

In such a battery monitoring system, if an anomaly occurs in the semiconductor device for battery voltage measurement, the voltage of the battery cell cannot be detected appropriately, and thus, a technique is known whereby diagnosis relating to anomalies in the semiconductor device for battery voltage measurement is performed (see, for example, Japanese Patent Application Laid-Open Publication No. 2015-156793 and Japanese Patent Application Laid-Open Publication No. 2013-185904).

As a conventional technique, a battery monitoring system exists such as the one shown in FIG. 20 that performs diagnosis relating to anomalies by providing two semiconductor devices for battery voltage measurement.

The battery monitoring system 1000 shown in FIG. 20 includes a battery monitoring integrated circuit (IC) 100 and a battery monitoring IC 200 having a similar configuration. The battery monitoring IC 100 and the battery monitoring IC 200 include equalizing switches 120, sample holding switches 122, cell selection switches 124, cell selection switches 126, and voltage measurement circuits 130.

In the battery monitoring system 1000 shown in FIG. 20, the voltage of the battery cell Vc is measured by the battery monitoring IC 100 and the battery monitoring IC 200 simultaneously, and it is determined that the battery monitoring ICs 100 and 200 are in normal operation if the difference in measurement results for the battery monitoring IC 100 and the battery monitoring IC 200 is 0V or less than or equal to a threshold. On the other hand, if the difference in measurement results between the battery monitoring IC 100 and the battery monitoring IC 200 exceeds the threshold, then it is determined that at least one of the battery monitoring ICs 100 and 200 is undergoing an anomaly.

SUMMARY OF THE INVENTION

The conventional battery monitoring system 1000 shown in FIG. 20 requires two semiconductor devices for monitoring battery voltage (battery monitoring IC 100 and battery monitoring IC 200), and each of the semiconductor devices requires external peripheral circuits, resulting in an increased overall chip size of the battery monitoring system.

An object of the present invention is to provide a semiconductor device, a battery monitoring system, and a diagnostic method for a semiconductor device by which it is possible to improve battery monitoring accuracy with a small circuit size.

A semiconductor device for measuring a voltage of a battery cell according to an aspect of the invention includes a first node configured to receive a first voltage, the first voltage being a voltage of a capacitor that accumulates an electric charge based on the voltage of the battery cell, a first battery voltage measurement unit configured to measure the first voltage through a first path, a second node configured to receive a second voltage based on the voltage of the battery cell, the second node being different from the first node, and a second battery voltage measurement unit configured to measure the second voltage through a second path that is different from the first path.

A semiconductor device for measuring a voltage of a battery cell according to another aspect of the invention includes a first node configured to receive a voltage of a first capacitor that accumulates a first electric charge based on the voltage of the battery cell, a first diagnostic voltage generating circuit configured to output a first diagnostic voltage, a second diagnostic voltage generating circuit configured to output a second diagnostic voltage, and a battery voltage measurement unit that measures a voltage of the first node for determining the voltage of the battery cell, and measures the first and second diagnostic voltages for performing a first diagnosis relating to an anomaly in the battery voltage measurement unit.

A battery monitoring system according to an aspect of the invention includes the above semiconductor device, and a diagnostic unit that is configured to compare measurement results of the first battery voltage measurement unit and measurement results of the second battery voltage measurement unit of the semiconductor device, and to perform diagnosis relating to an anomaly in the semiconductor device on the basis of a result of the comparison.

A battery monitoring system according to another aspect of the invention includes a plurality of battery cells connected in series, the above semiconductor device that operates on the basis of a control signal to measure a voltage of each of the plurality of battery cells using the first battery voltage measurement unit, a diagnostic unit that is configured to compare measurement results of the first battery voltage measurement unit and measurement results of the second battery voltage measurement unit of the semiconductor device, and to perform diagnosis relating to an anomaly in the semiconductor device on the basis of a result of the comparison, and a control device that is configured to output the control signal to the semiconductor device.

A method for diagnosing an anomaly in a semiconductor device according to an aspect of the invention, the semiconductor device monitoring a voltage of a battery cell, the method includes providing a first node that receives a first voltage, the first voltage being a voltage of a capacitor that accumulates an electric charge based on the voltage of the battery cell, measuring, through a first path, a voltage of the first node using a first battery voltage measurement unit, providing a second node that receives a second voltage based on the voltage of the battery cell, the second node being different from the first node, measuring, through a second path differing from the first path, a voltage of the second node using a second battery voltage measurement unit, and performing, using a diagnostic unit, diagnosis using comparison results between measurement results of the first battery voltage measurement unit and measurement results of the second battery voltage measurement unit.

The present invention exhibits the effect that it is possible to improve battery monitoring accuracy with a small circuit size.

DETAILED DESCRIPTION OF EMBODIMENTS

Embodiments will be explained in detail below with reference to drawings.

Embodiment 1

Figure 1:
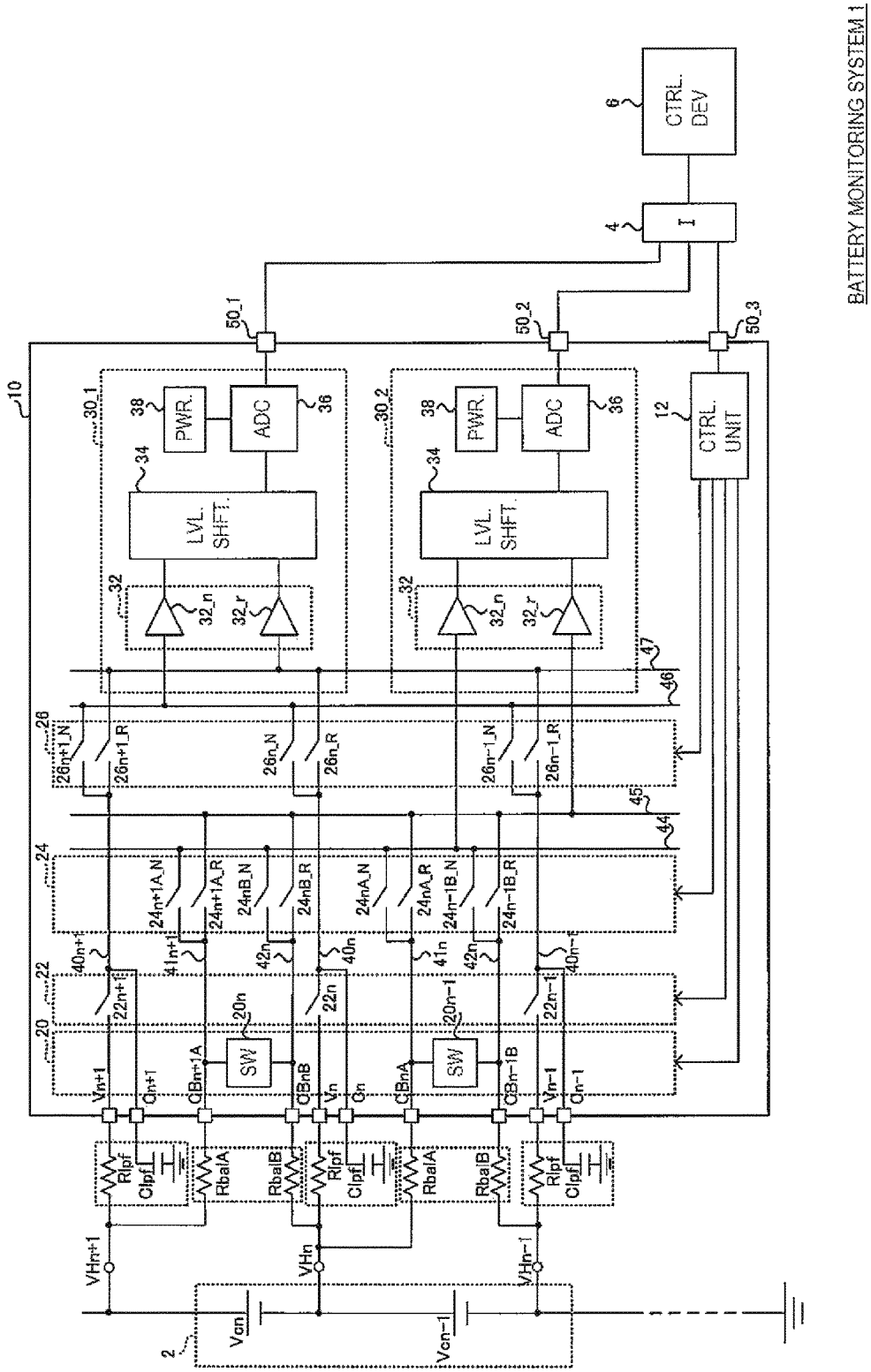
FIG. 1 is a schematic configuration drawing of an example of a battery monitoring system of Embodiment 1.

First, a configuration of a battery monitoring system of the present embodiment will be described. FIG. 1 shows a circuit diagram representing a configuration of an example of a battery monitoring system 1 of the present embodiment.

As shown in FIG. 1, the battery monitoring system 1 of the present embodiment includes a battery assembly 2, an interface 4, a control device 6, and a battery monitoring IC 10.

FIG. 1 shows only battery cells Vcn and Vcn−1, but the battery assembly 2 includes an n number of battery cells Vc1 to Vcn, which are connected in series and arranged such that the battery cell Vcn is on the highest potential side and the battery cell Vc1 is on the lowest potential side. In the battery monitoring system 1 of the present embodiment, the potential on the low potential side of the battery cell Vc1 is equal to ground potential. There is no limitation on the number of battery cells Vc (that is, the value of n) included in the battery assembly 2.

Below, "battery cells Vc" is used to collectively refer to the battery cells Vc1 to Vcn. Also, regarding various components (details to be mentioned later) such as equalizing switches 20 connected to the battery cells Vc, when talking specifically about individual such components, reference characters 1 to n+1 are added, and when collectively referring to the components such reference characters are omitted.

The control device 6 is connected to the battery monitoring IC 10 through the interface 4. The control device 6 is a microcontroller unit (MCU) or the like, for example, and is configured to receive through the interface 4 a digital signal corresponding to the voltage of the battery cells Vc as input from a terminal 50_1 of the battery monitoring IC 10. The control device 6 is configured to output through the interface 4 a control signal for performing control relating to the voltage of the battery cells Vc on the basis of the digital signal, to a terminal 50_3 of the battery monitoring IC 10.

The control signal is inputted from the terminal 50_3 to a control unit 12. The control unit 12 is configured to control each switch included among the equalizing switches (SWs) 20, sample holding SWs 22, cell selection SWs 24, and cell selection SWs 26 to be on or off.

The battery monitoring IC 10 of the present embodiment is a semiconductor device that is configured to monitor the voltage of each battery cell Vc of the battery assembly 2 by the control unit 12 performing control according to the control signal.

The battery monitoring IC 10 includes the control unit 12, the equalizing switches 20, the sample holding switches 22, the cell selection switches 24, and the cell selection switches 26.

Among the equalizing switches 20 (hereinafter referred to as "equalizing SWs 20"), only the equalizing SWs 20n and 20n−1 are shown in FIG. 1, but the equalizing SWs 20 include equalizing SWs $20_1$-$20n$. Among the sample holding switches 22 (hereinafter referred to as "S/H SWs 22"), only 20n−1 to 22n+1 are shown in FIG. 1, but the S/H SWs 22 include S/H SWs $22_1$-$22n+1$. Also, among the cell selection switches 24 (hereinafter referred to as "cell selection SWs 24), only the cell selection SWs 24nA_R, 24n+1A_R, 24A_N, 24n+1A_N, 24n−1B_R, 24nB_R, 24n−1B_N, and 24nB_N are shown in FIG. 1, but the cell selection SWs 24 include cell selection SWs $24_1$B_R to 24nB_R, $24_1$B_N to 24nB_N, $24_2$A_R to 24n+1A_R, and $24_2$A_N to 24n+1A_N. Furthermore, among the cell selection switches 26 (hereinafter referred to as "cell selection SWs 26"), only the cell selection SWs 26n−1_R to 26n+1_R and 26n−1_N to 26n+1_N are shown in FIG. 1, but the cell selection SWs 26 include cell selection SWs $26_1$_R to 26n+1_R and $26_1$_N to 26n+1_N.

Also, the battery monitoring IC 10 of the present embodiment includes terminals C1 to Cn+1 (below, "terminals C" when referred to collectively) connected to a capacitor Clpf disposed externally. The battery monitoring IC 10 also includes terminals V1 to Vn+1 (below, "terminals V" when referred to collectively) connected to the battery cells Vc through resistors Rlpf. In the battery monitoring system 1 of the present embodiment, a low-pass filter (hereinafter, "LPF") is constituted of the resistor Rlpf and the capacitor Clpf.

Terminals CB2A to CBn+1A (below, "terminals CBA" when referred to collectively) connected to the battery cells Vc through resistors RbalA are also included. Terminals CB1B to CBnB (below, "terminals CBB" when referred to collectively) connected to the battery cells Vc through resistors RbalB are also included.

Furthermore, the battery monitoring IC 10 of the present embodiment includes voltage measurement circuits 30_1 and 30_2. Since the voltage measurement circuits 30_1 and 30_2 have the same configuration, "voltage measurement circuit 30" is used to refer to both collectively when no distinction between individual voltage measurement circuits is being made. The voltage measurement circuit 30_1 corresponds to the first battery voltage measurement unit of the present invention, and the voltage measurement circuit 30_2 corresponds to the second battery voltage measurement unit of the present invention.

The voltage measurement circuit 30 includes buffer amplifiers 32, a level shifter 34, an analog-to-digital converter (ADC) 36, and a reference power supply 38. The buffer amplifier 32 includes buffer amplifiers 32_n and 32_r. In the voltage measurement circuit 30_1, the input terminal of the buffer amplifier 32_n is connected to a signal line 46, and the input terminal of the buffer amplifier 32_r is connected to the signal line 47. In the voltage measurement circuit 30_2, the input terminal of the buffer amplifier 32_n is connected to a signal line 44, and the input terminal of the buffer amplifier 32_r is connected to the signal line 45.

The level shifter 34 outputs the difference between the voltage inputted from the buffer amplifier 32_n and the voltage inputted from the buffer amplifier 32_r as a voltage relative to ground (0V). The ADC 36 performs A/D conversion on the voltage outputted from the level shifter 34 on the basis of a reference voltage VREF supplied from the reference power supply 38 and generates a digital signal, and outputs the generated digital signal to outside of the voltage measurement circuit 30. The digital signal outputted from the voltage measurement circuit 30_1 is outputted to the control device 6 through the terminal 50_1. The digital signal outputted from the voltage measurement circuit 30_2 is outputted to the control device 6 through the terminal 50_2.

The connection between the battery cells Vc and the battery monitoring IC 10 and the connection of the internal circuitry (equalizing SWs 20, etc.) of the battery monitoring IC 10 will be described. FIG. 1 only shows the battery cells Vcn and Vcn−1, and the configuration of the battery monitoring IC 10 connected to each battery cell Vc is only shown for the battery cells Vcn and Vcn−1, but the battery monitoring IC 10 has a similar configuration for the battery cells Vc1 to Vcn−2. Thus, the connection of the battery monitoring IC 10 to the battery cell Vcn will be described as a specific example.

The high potential side of the battery cell Vcn is connected to the terminal Vn+1 of the battery monitoring IC 10 through the resistor Rlpf. The terminal Vn+1 is connected to one terminal of the S/H SW 22n+1, and the other terminal of the S/H SW 22n+1 is connected to the signal line 40n+1. The other terminal of the S/H SW 22n+1 is connected through the terminal Cn+1 to one electrode of the capacitor Clpf provided to the outside of the battery monitoring IC 10. The other electrode of the capacitor Clpf is fixed at ground potential. The signal line 40n+1 is connected to the signal line 46 through the cell selection SW 26n+1_N. The signal line 40n+1 is connected to the signal line 47 through the cell selection SW 26n+1_R.

The high potential side of the battery cell Vcn is connected to the terminal CBn+1A of the battery monitoring IC 10 through the resistor RbalA. The signal line 41n+1 is connected to the terminal CBn+1A. The signal line 41n+1 is connected to the signal line 44 through the cell selection SW 24n+1A_N. The signal line 41n+1 is connected to the signal line 45 through the cell selection SW 24n+1A_R.

The low potential side of the battery cell Vcn is connected to the terminal CBnB of the battery monitoring IC 10 through the resistor RbalB. The signal line 42n is connected to the terminal CBnB. The signal line 42n is connected to the signal line 44 through the cell selection SW 24nB_N. The signal line 42n is connected to the signal line 45 through the cell selection SW 24nB_R.

The equalizing switch 20n is connected between the signal line 41n+1 and the signal line 42n.

Next, a measurement method for the voltage of each battery cell Vc of the battery assembly 2 by the battery monitoring system 1 of the present embodiment will be described. Measurement of the voltage of the battery cells Vc is performed by the voltage measurement circuit 30_1.

First, the control device 6 turns on all S/H SWs 22 using the control unit 12, and turns off all cell selection SWs 24 and cell selection SWs 26. Also, the control device 6 turns off all equalizing SWs 20 using the control unit 12.

In this case, the voltage of the battery cell Vc is applied to the capacitor Clpf through the resistor Rlpf and the S/H SW 22. An electric charge based on the voltage of the battery cell Vc accumulates in the capacitor Clpf.

When measuring the voltage of each battery cell Vc, the control device 6 turns on all S/H SWs 22, and by sequentially measuring the electric charge accumulated in the capacitors Clpf, the voltage of each battery cell Vc is measured.

A case in which the voltage of the battery cell Vcn is measured will be described as a specific example. All equalizing SWs 20 remain off.

First, the S/H SWs 22n+1 and 22n are turned on, and an electric charge based on the voltage of the high potential side of the battery cell Vcn accumulates in the capacitor Clpf connected to the terminal Cn+1. Also, an electric charge based on the voltage of the low potential side of the battery cell Vcn accumulates in the capacitor Clpf connected to the terminal Cn.

Next, the S/H SWs 22 are turned off and the cell selection SW 26n+1_N and the cell selection SW 26n_R are turned on. In this manner, the voltage of the terminal Cn+1 is applied to the buffer amplifier 32_n of the voltage measurement circuit 30_1, and the voltage of the terminal Cn is applied to the buffer amplifier 32_r. The voltage of the terminal Cn+1 outputted from the buffer amplifier 32_n and the voltage of the terminal Cn outputted from the buffer amplifier 32_r are inputted to the level shifter 34, and the difference between the voltage of the terminal Cn+1 and the voltage of the terminal Cn is outputted from the level shifter 34. The difference in voltage outputted from the level shifter 34 is converted to a digital signal by the ADC 36 and outputted to the control device 6.

The voltages of the battery cells Vc1 to Vcn−1 are also measured sequentially by a similar method to the battery cell Vc above.

The control device 6 determines whether there is variation in the voltages of the battery cells Vc on the basis of the digital signal inputted from the battery monitoring IC 10. If there is variation, the control device 6 turns on the equalizing SW 20 of the battery cell Vc where the variation has occurred, causing a discharge of voltage from the battery cell Vc and equalizing the voltage of the battery cells Vc.

Figure 2:
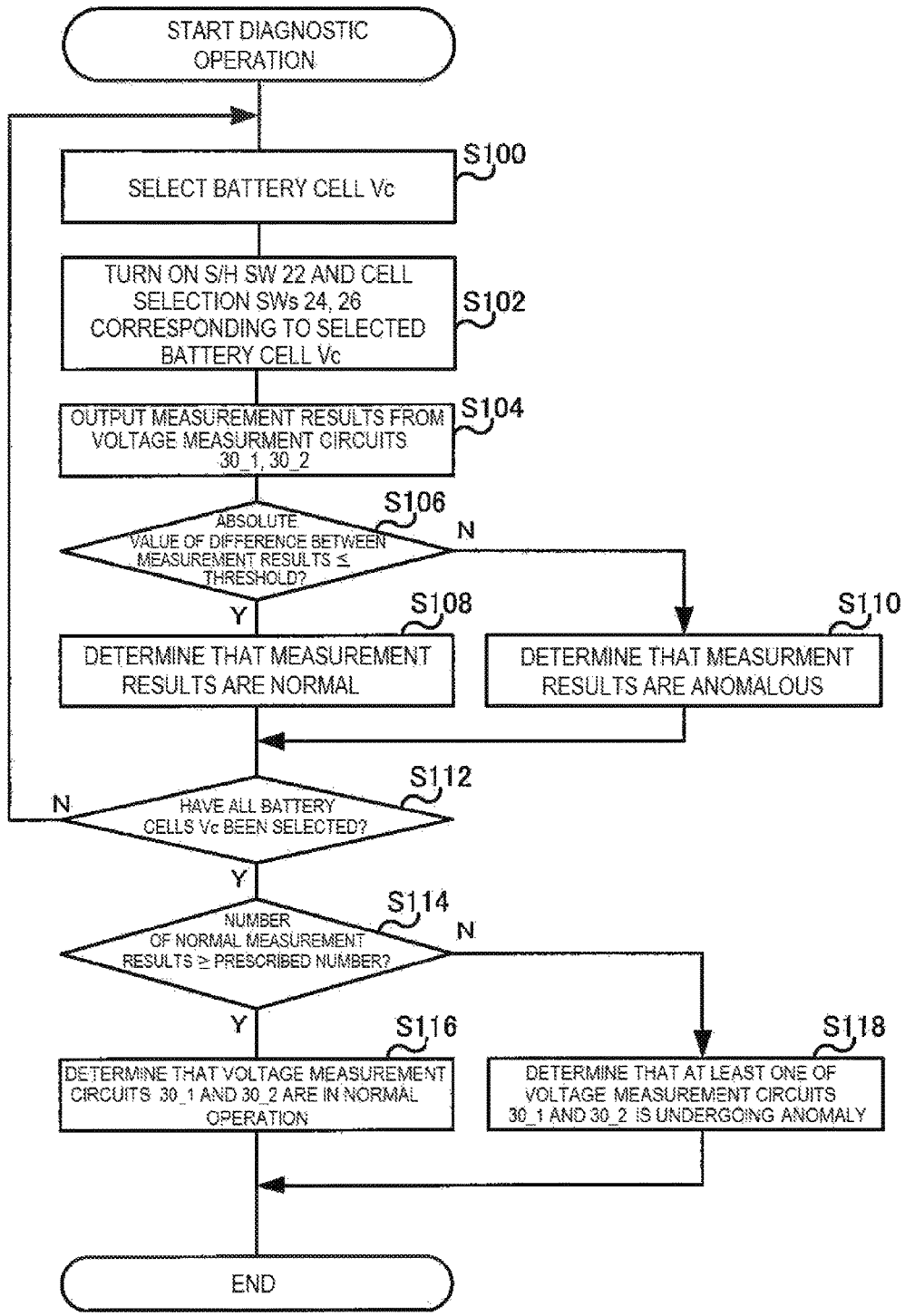
FIG. 2 is a flowchart showing on example of a diagnostic flow pertaining to an anomaly in a battery monitoring IC in a battery monitoring system of Embodiment 1.

Next, the diagnostic method relating to anomalies in the battery monitoring IC 10 will be described. FIG. 2 shows a flowchart representing one example of an operational flow for diagnosis relating to anomalies in the battery monitoring IC 10 (hereinafter simply referred to as "diagnosis").

There is no special limitation on the timing at which diagnosis relating to anomalies in the battery monitoring IC 10 is performed, but in the battery monitoring system 1 of the present embodiment, diagnosis is performed in a state in which an electric charge based on the voltage of each battery cell Vc is accumulated in each capacitor Clpf. Thus, by continuing to perform diagnosis after measurement of the voltage of each battery cell Vc, it is possible to perform diagnosis using the electric charge that has accumulated in the capacitor Clpf when measuring the voltage of the battery cell Vc as described above. If the time from measurement of the voltage of the battery cell Vc to diagnosis is long, sometimes the electric charge that has accumulated in the capacitor Clpf is discharged, and in such a case, it is preferable that electric charge based on the voltage of the battery cell Vc accumulate again in the capacitor Clpf prior to performing diagnosis.

Before the start of the diagnostic operation, the control device 6 turns off all equalizing SWs 20, S/H SWs 22, and cell selection SWs 24 and 26.

First, in step S100, the control device 6 selects one battery cell Vc from among the battery cells Vc of the battery assembly 2. A case in which the battery cell Vcn is selected will be described below as a specific example.

In the next step S102, the control device 6 turns on the S/H SWs 22 and cell selection SWs 24 and 26 corresponding to the selected battery cell Vc.

Figure 3:
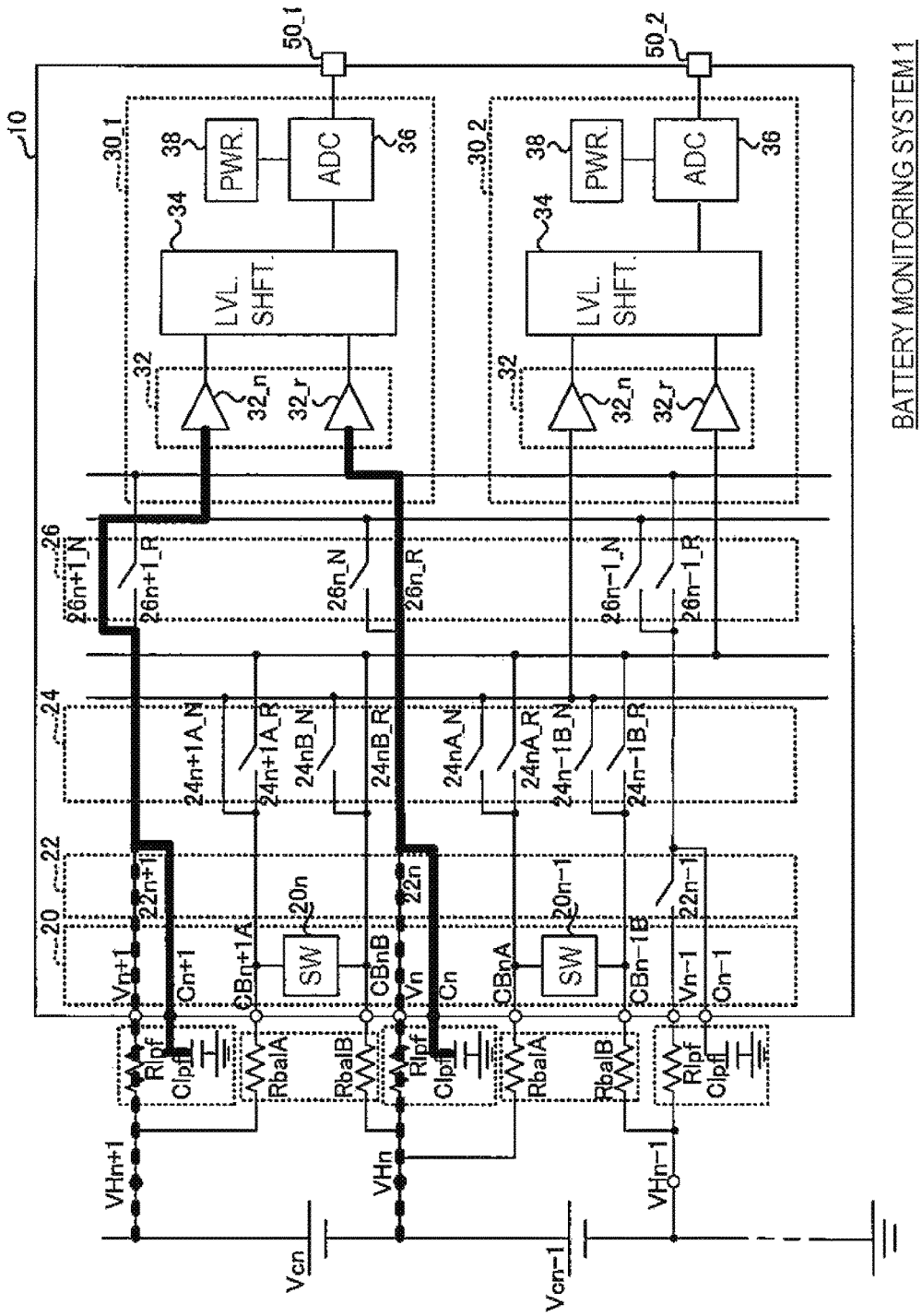
FIG. 3 shows current paths from capacitors corresponding to battery cells to a voltage measurement circuit 30_1.

If the battery cell Vcn is selected, then as shown in FIG. 3, the S/H SWs 22$n$+1 and 22$n$ and the cell selection SWs 26$n$+1_N and 26$n$_R are turned on. In this manner, as shown in FIG. 3, the voltage of the terminal Cn+1 is applied to the buffer amplifier 32_$n$ of the voltage measurement circuit 30_1. Also, the voltage of the terminal Cn is applied to the buffer amplifier 32_$r$ of the voltage measurement circuit 30_1. At this time, a voltage based on the electric charge accumulated in the capacitor Clpf is applied to the terminal Cn+1 on the basis of the voltage on the high potential side of the battery cell Vc, and a voltage based on the electric charge accumulated in the capacitor Clpf is applied to the terminal Cn on the basis of the voltage on the low potential side of the battery cell Vc. In this case, the path where current flows from the capacitor Clpf shown in FIG. 3 to the buffer amplifier 32 of the voltage measurement circuit 30_1 corresponds to the first path of the present invention. Also, in this case, the terminal Cn+1 and the terminal Cn correspond to the first node of the present invention.

Figure 4:
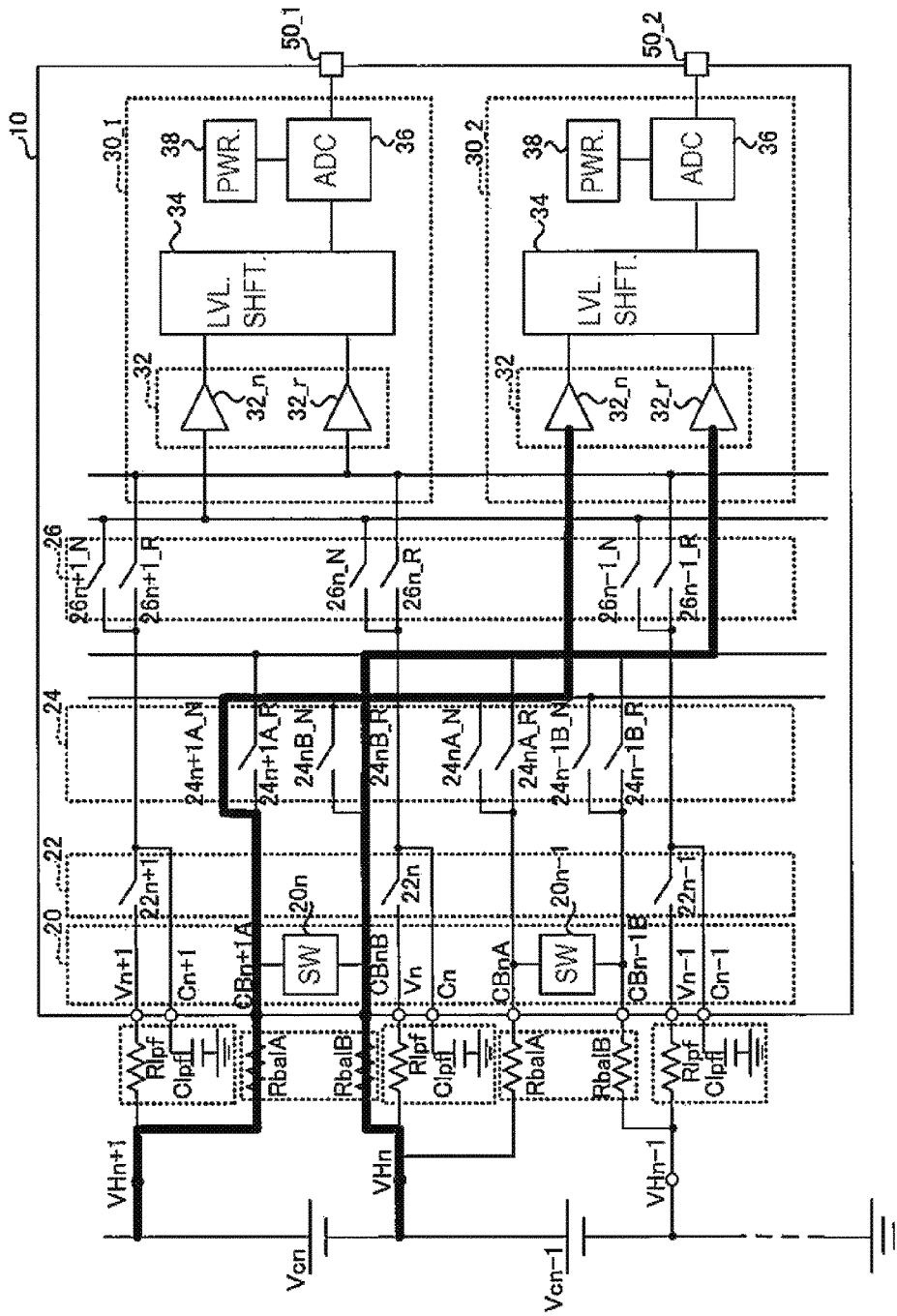
FIG. 4 shows current paths from battery cells to a voltage measurement circuit 30_2.

As shown in FIG. 4, the cell selection SW 24$n$+1A_N and the cell selection SW 24$n$B_R are turned on. In this manner, as shown in FIG. 4, the voltage of the terminal CBn+1A is applied to the buffer amplifier 32_$n$ of the voltage measurement circuit 30_2. Also, the voltage of the terminal CBnB is applied to the buffer amplifier 32_$r$ of the voltage measurement circuit 30_2. At this time, the voltage on the high potential side of the battery cell Vc is applied to the terminal CBn+1A, and the voltage on the low potential side of the battery cell Vc is applied to the terminal CBnB. In this case, the path where current flows from the battery cell Vc shown in FIG. 4 to the buffer amplifier 32 of the voltage measurement circuit 30_2 corresponds to the second path of the present invention. Also, in this case, the terminal CBn+1A and the terminal CBnB correspond to the second node of the present invention.

In the next step S104, the measurement results from the voltage measurement circuits 30_1 and 30_2 are outputted to the control device 6 through the control units 50_1 and 50_2.

When the battery cell Vcn is selected, the voltage measurement circuit 30_1 outputs the difference between the voltage of the terminal Cn+1 and the voltage of the terminal Cn as measurement results. Also, the voltage measurement circuit 30_2 outputs the difference between the voltage of the terminal CBn+1A and the voltage of the terminal CBnB as measurement results.

In the next step S106, the control device 6 compares the measurement results of the voltage measurement circuit 30_1 with the measurement results of the voltage measurement circuit 30_2, and determines whether the absolute value of the difference therebetween is less than or equal to a threshold (includes 0V). When the measurement results are normal, the difference between the measurement results of the voltage measurement circuit 30_1 and the measurement results of the voltage measurement circuit 30_2 would be at 0V. In the present embodiment, a threshold that takes into account the impact of measurement errors and the like is set, and if the difference between the measurement results of the voltage measurement circuit 30_1 and the measurement results of the voltage measurement circuit 30_2 is less than or equal to the threshold, it is determined that the measurement results are normal.

Thus, if the absolute value of the difference between the measurement results is less than or equal to the threshold, the process progresses to step S108, and the control device 6 determines that the measurement results are normal. On the other hand, if the absolute value of the difference between the measurement results exceeds the threshold, the process progresses to step S110, and the control device 6 determines that the measurement results are anomalous.

Once it is determined whether the measurement results are normal or anomalous, in the following step S112 the control device 6 determines whether all battery cells Vc have been selected.

If there are battery cells Vc that have not yet been selected, the process returns to step S100 and the operation described above is repeated. In this case, the switches that were turned on in step S102 are turned off before the process returns to step S100.

On the other hand, if all battery cells Vc have been selected, then the process progresses to step S114.

In step S114, the control device 6 determines whether the number of normal measurement results is greater than or equal to a prescribed number. A case in which it is determined that the measurement results are anomalous as described above (step S110) includes a case in which an anomaly has occurred in at least one of the voltage measurement circuits 30_1 and 30_2, a case in which an anomaly has occurred in parts (cell selection SWs 24, the current path, or the like) of other circuits of the battery monitoring IC 10, or both cases.

If an anomaly has occurred in at least one of the voltage measurement circuits 30_1 and 30_2, it is assumed that a large portion of the plurality of measurement results will be determined to be anomalous. In the present embodiment, if the number of normal measurement results is greater than or equal to a prescribed value ("yes" in step S114), then the control device 6 determines as shown in step S116 that the voltage measurement circuits 30_1 and 30_2 are in normal operation, and the diagnostic operation is ended. If the number of normal measurement results is less than the prescribed value ("no" in step S114), then the control device 6 determines as shown in step S118 that at least one of the voltage measurement circuits 30_1 and 30_2 is undergoing an anomaly, and the diagnostic operation is ended.

There is no special limitation on the operations of steps S114 to S118 of the diagnostic operation described above. If, for example, the number of normal measurement results is greater than or equal to a prescribed value, then it may be determined that there is an anomaly in the S/H SWs 22 and the cell selection SWs 24 and 26 that were turned on when diagnosing battery cells Vc having measurement results determined to be abnormal, as well as anomalies in the current path or the like.

Also, the control device 6 may naturally perform a predetermined operation (such as notification or the like of diagnostic results) in response to the results of the diagnostic operation.

As described above, in the battery monitoring system 1 of the present embodiment, the battery monitoring IC 10 includes: the terminal C to which is applied a voltage based on the electric charge that has accumulated in the capacitor Clpf, which accumulates an electric charge based on the voltage of the battery cell Vc; the voltage measurement circuit 30_1, which measures the voltage of the terminal C through the first path; the terminals CBA and CBB, which differ from the terminal C, and to which a voltage based on the voltage of the battery cell Vc is applied; and the voltage measurement circuit 30_2, which measures the voltages of the terminals CBA and CBB through the second path, which differs from the first path.

When performing diagnosis of the battery monitoring IC 10, the control device 6 compares the measurement results of the voltage measurement circuit 30_1 and the measurement results of the voltage measurement circuit 30_2, and determines that the results are normal if the difference therebetween is within a threshold, and determines that the results are anomalous if the difference therebetween exceeds the threshold.

In this manner, in the battery monitoring system 1 of the present embodiment, it is possible using one battery monitoring IC 10 to measure the voltage of each battery cell Vc included in the battery assembly 2 and to perform diagnosis relating to anomalies in the battery monitoring IC 10.

Figure 20:
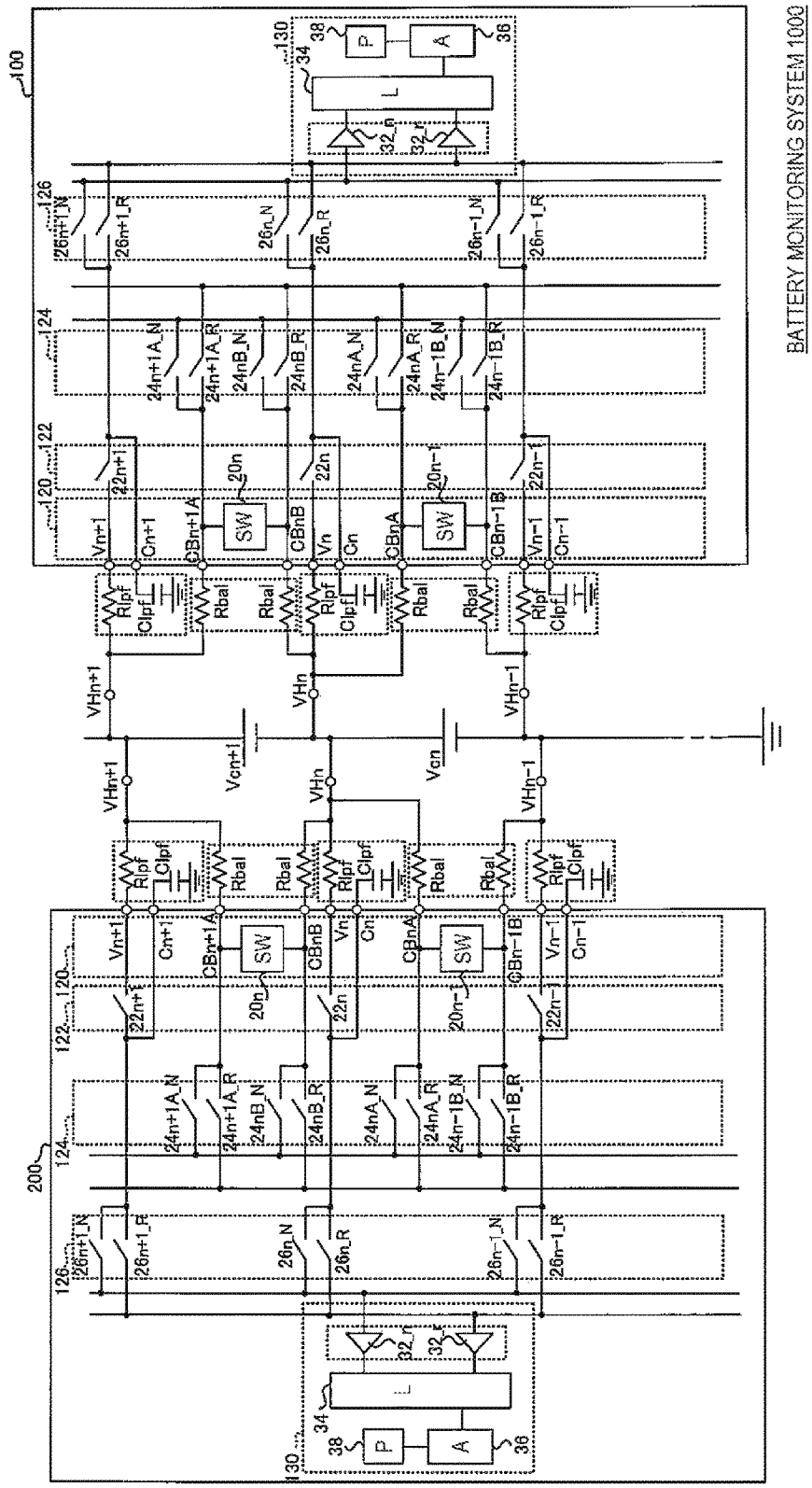
FIG. 20 is a schematic configuration drawing of an example of a conventional battery monitoring system.

In this manner, there is no need to provide two battery monitoring ICs 10 as in the conventional battery monitoring IC 1000 shown in FIG. 20, and thus, it is possible not only to reduce the number of battery monitoring ICs 10 included in the battery monitoring system 1, but to also reduce the number of peripheral parts necessary as additions to the battery monitoring IC 10 (such as the resistors Rlpf, capacitors Clpf, interfaces with external control devices, and the like).

Thus, according to the battery monitoring IC 10 of the present embodiment, it is possible to improve battery monitoring accuracy with a small circuit size.

In the present embodiment, in step S102 of the diagnostic operation, the S/H SWs 22n+1 and 22n are turned on, but these switches may remain off without being turned on. By turning these switches on, current would flow in the paths indicated with dotted lines in FIG. 3 from the high potential side of the battery cell Vcn to the S/H SW 22n+1 and from the low potential side to the S/H SW 22n. Thus, even if discharge or the like of the electric charge that has accumulated in the capacitor Clpf connected to the terminal Cn+1 and the capacitor Clpf connected to the terminal Cn were to occur, it is possible to mitigate a decrease in measurement accuracy of the voltage of the battery cell Vc.

Embodiment 2

Figure 5:
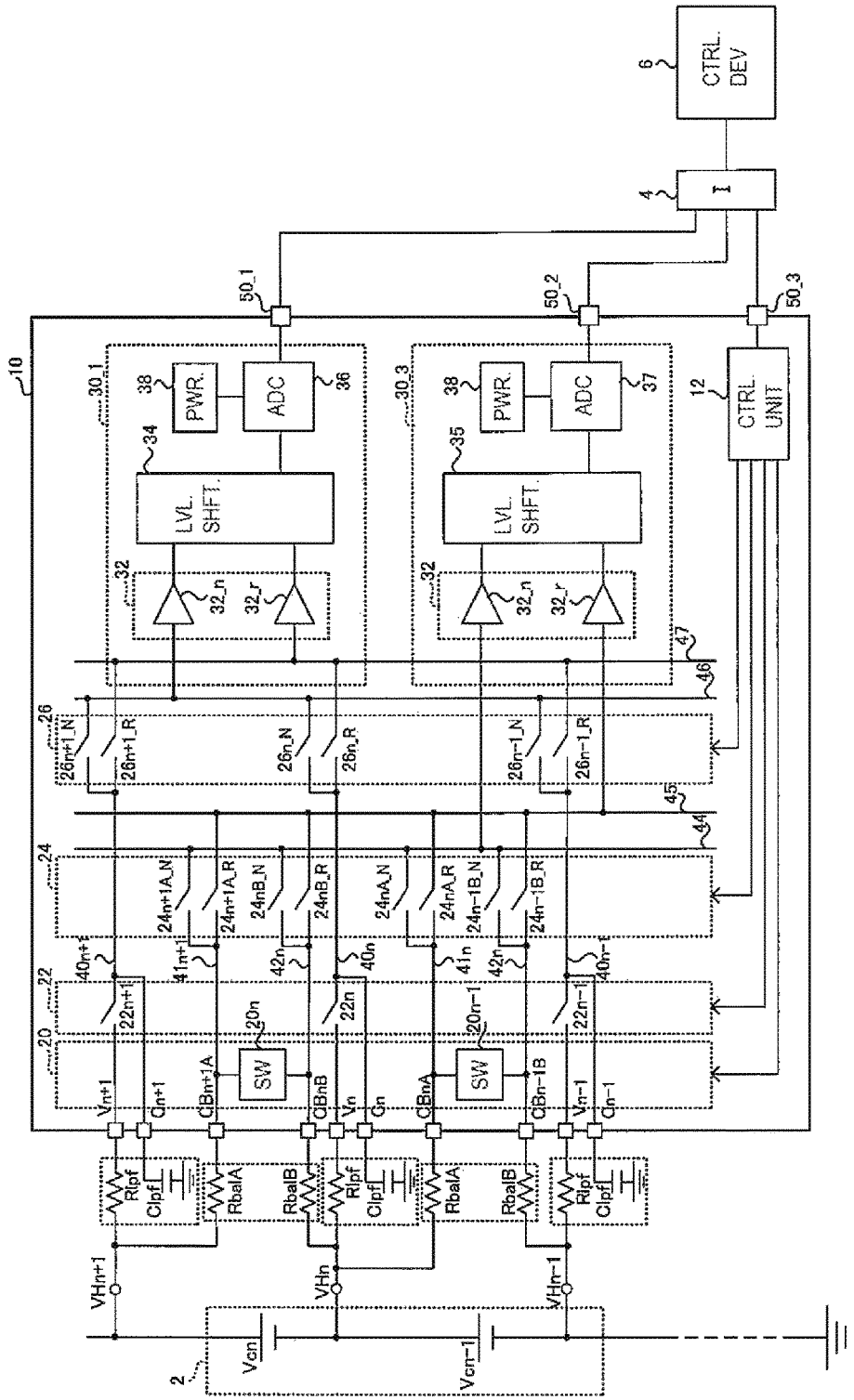
FIG. 5 is a schematic configuration drawing of an example of a battery monitoring system of Embodiment 2.

A battery monitoring system 1 of the present embodiment has a different configuration of the battery monitoring IC 10 than Embodiment 1. FIG. 5 shows a circuit diagram representing a configuration of an example of a battery monitoring system 1 of the present embodiment.

As shown in FIG. 5, the battery monitoring IC 10 of the present embodiment has a similar configuration to that of Embodiment 1 other than that the battery monitoring IC 10 includes a battery monitoring IC 30_3 instead of the battery monitoring IC 30_1 of the battery monitoring IC 10 (see FIG. 1) of Embodiment 1.

The voltage measurement circuit 30_3 includes buffer amplifiers 32, a level shifter 35, an ADC 37, and a reference power supply 38. The level shifter 35 has a lower operational speed than the level shifter 34. Also, the ADC 37 has a lower bit resolution than the ADC 36, and is thus a low resolution ADC.

Thus, the voltage measurement circuit 30_3 has a lower measurement accuracy for battery voltage compared to the voltage measurement circuit 30_1. On the other hand, the chip sizes of the level shifter 35 and the ADC 37 can be made smaller than the chip sizes of the level shifter 34 and the ADC 36. Thus, the voltage measurement circuit 30_3 can have a smaller size compared to the voltage measurement circuit 30_1.

Thus, the battery monitoring IC 10 of the present embodiment can have a smaller overall chip size than the battery monitoring IC 10 of Embodiment 1.

A measurement method for the voltage of each battery cell Vc by the battery monitoring system 1 of the present embodiment is similar to that of the battery monitoring system 1 of Embodiment 1, and thus, descriptions thereof are omitted.

The overall process flow diagnostic operation of the battery monitoring IC 10 by the battery monitoring system 1 of the present embodiment is substantially similar to the process flow of the diagnostic operation of Embodiment 1 (see FIG. 2), but the threshold used for determination in step S106 differs. In step S106, it is determined whether the absolute value of the difference in measurement values is less than or equal to a threshold.

As described above, the measurement accuracy differs between the voltage measurement circuit 30_1 and the voltage measurement circuit 30_3. Thus, even in normal operation, the measurement results of the voltage measurement circuit 30_1 may not match the measurement results of the voltage measurement circuit 30_3. Therefore, in the present embodiment, a threshold used for determination in step S106 is set in advance, taking into account the difference in accuracy. Thus, the threshold used in step S106 is greater in Embodiment 2 than in Embodiment 1.

As described above, it is not possible to reduce chip size while maintaining measurement accuracy, and thus, based on the desired chip size, desired measurement accuracy, and the like, it should be determined to what degree the operational speed of the level shifter 35 is to be reduced compared to the level shifter 34, and to what degree the resolution (number of bits) of the ADC 37 is to be reduced compared to the ADC 36.

In this manner, similar to Embodiment 1, in the battery monitoring system 1 of the present embodiment, it is possible using one battery monitoring IC 10 to measure the voltage of each battery cell Vc included in the battery assembly 2 and to perform diagnosis relating to anomalies in the battery monitoring IC 10. Thus, according to the battery monitoring IC 10 of the present embodiment, it is possible to improve battery monitoring accuracy with a small circuit size.

Also, according to the battery monitoring IC 10 of the present embodiment, it is possible to have a smaller chip size than the battery monitoring IC 10 of Embodiment 1.

Embodiment 3

Figure 6:
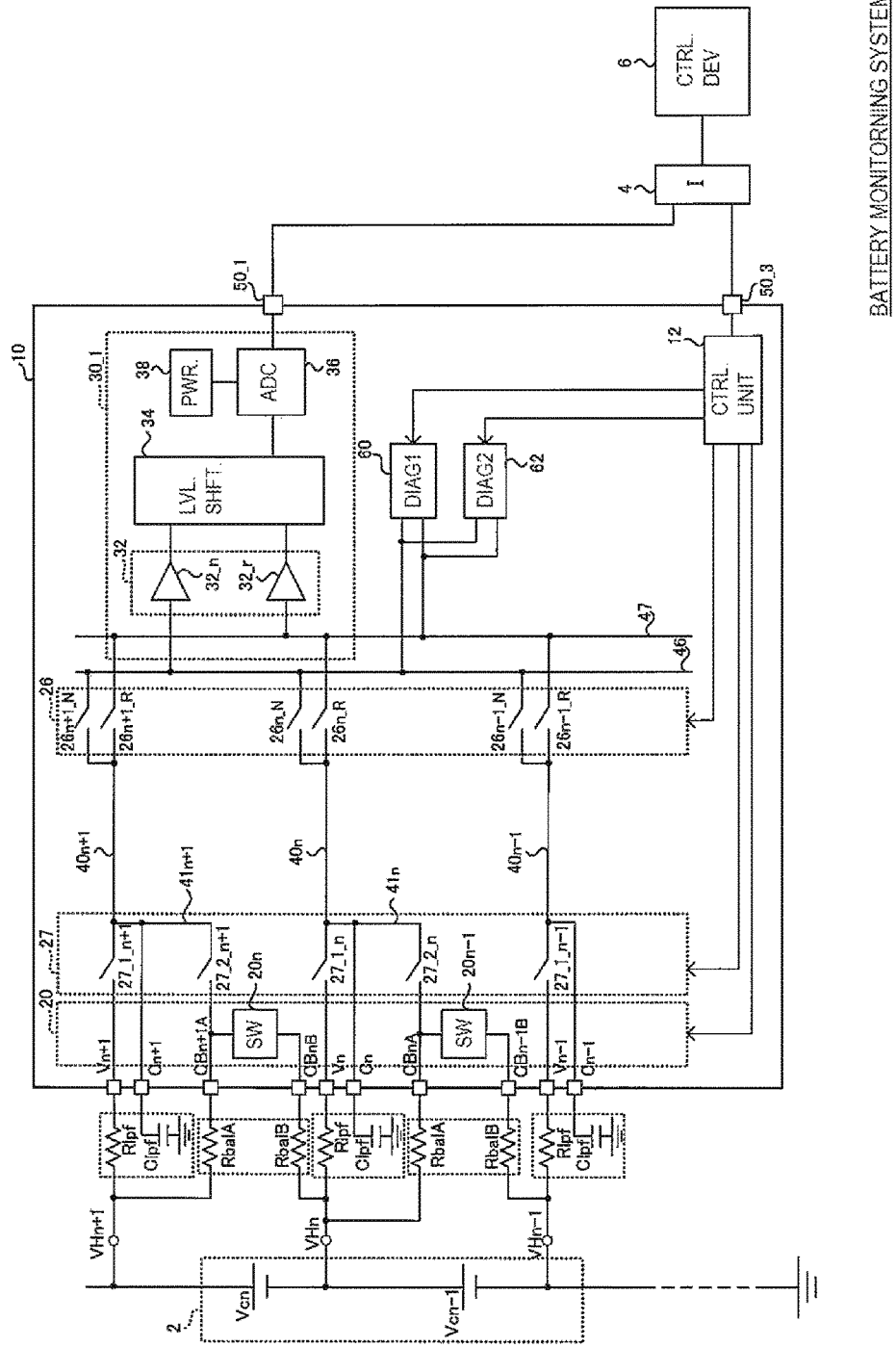
FIG. 6 is a schematic configuration drawing of an example of a battery monitoring system of Embodiment 3.

A battery monitoring system 1 of the present embodiment has a different configuration of the battery monitoring IC 10 than the embodiments above. FIG. 6 shows a circuit diagram representing a configuration of an example of a battery monitoring system 1 of the present embodiment.

As shown in FIG. 6, the battery monitoring IC 10 of the present embodiment includes an S/H SW 27 instead of the S/H SW 22 of the battery monitoring IC 10 (see FIG. 1) of Embodiment 1. Also, the battery monitoring IC 10 of the present embodiment does not include the cell selection SWs 24 or the signal lines 44 and 45, which the battery monitoring IC 10 of Embodiment 1 includes. Additionally, the battery monitoring IC 10 of the present embodiment differs from the battery monitoring IC 10 of Embodiment 1 in terms of the connective relationship of the equalizing SWs 20.

The connection of the battery monitoring IC 10 to the battery cell Vcn will be described as a specific example. The terminal CBnB is connected to only one end of the equalizing SW 20n. Also, the terminal CBn+1A and the other end of the equalizing SW 20n are connected to the signal line 41n+1 through the S/H SW 27n+1. The terminal Vn+1 is connected to the signal line 40n+1 through the S/H SW 27_n+1. The terminal Cn+1 is connected between the S/H SW 27_1_n+1 and the S/H SW 27_2_n+1.

Also, as shown in FIG. 6, the battery monitoring IC 10 of the present embodiment includes a first diagnostic voltage generating circuit 60 and second diagnostic voltage generating circuit 62 instead of the voltage measurement circuit 30_2 of the battery monitoring IC 10 (see FIG. 1) of Embodiment 1.

When performing diagnosis of the battery monitoring IC 10, the control unit 12 causes the first diagnostic voltage generating circuit 60 to generate a first diagnostic voltage and causes the second diagnostic voltage generating circuit 62 to generate a second diagnostic voltage, on the basis of a control signal outputted by the control device 6.

The first diagnostic voltage generating circuit 60 generates the first diagnostic voltage in order to perform diagnosis of the battery monitoring IC 10 on the basis of control performed by the control unit 12 and outputs the first diagnostic voltage to the signal lines 46 and 47. There is no special limitation on the first diagnostic voltage, but it is preferable that it be equivalent to the voltage of the battery cell Vc (initial voltage of the battery cell Vc).

The second diagnostic voltage generating circuit 62 generates the second diagnostic voltage in order to perform diagnosis of the battery monitoring IC 10 on the basis of control performed by the control unit 12 and outputs the second diagnostic voltage to the signal lines 46 and 47. The second diagnostic voltage generated by the second diagnostic voltage generating circuit 62 is equal to the first diagnostic voltage. As an alternative to the present embodiment, the first diagnostic voltage and the second diagnostic voltage may differ from each other.

Next, a measurement method for the voltage of each battery cell Vc of the battery assembly 2 by the battery monitoring system 1 of the present embodiment will be described. Measurement of the voltage of the battery cells Vc is performed by the voltage measurement circuit 30_1.

First, the control device 6 turns on all S/H SWs 27 using the control unit 12, and turns off all cell selection SWs 26. Also, the control device 6 turns off all equalizing SWs 20 using the control unit 12.

In this case, the voltage of the battery cell Vc is applied to the capacitor Clpf through the resistor Rlpf and the S/H SW 27. An electric charge based on the voltage of the battery cell Vc accumulates in the capacitor Clpf.

When measuring the voltage of each battery cell Vc, the control device 6 turns on all S/H SWs 27, and by sequentially measuring the voltage accumulated in the capacitors Clpf, the voltage of each battery cell Vc is measured.

A case in which the voltage of the battery cell Vcn is measured will be described as a specific example. All equalizing SWs 20 remain off.

First, the S/H SWs 27_1_n+1 and 27_1_n among the S/H SWs 27 are turned on, and an electric charge based on the voltage of the high potential side of the battery cell Vcn accumulates in the capacitor Clpf connected to the terminal Cn+1. Also, an electric charge based on the voltage of the low potential side of the battery cell Vcn accumulates in the capacitor Clpf connected to the terminal Cn.

Next, after the S/H SWs 27 are turned off, the voltage measurement circuit 30_1 measures the voltage of the battery cell Vcn on the basis of the electric charge accumulated in the capacitor Clpf, but descriptions thereof will be omitted since this operation is similar to that of Embodiment 1.

Figure 7:
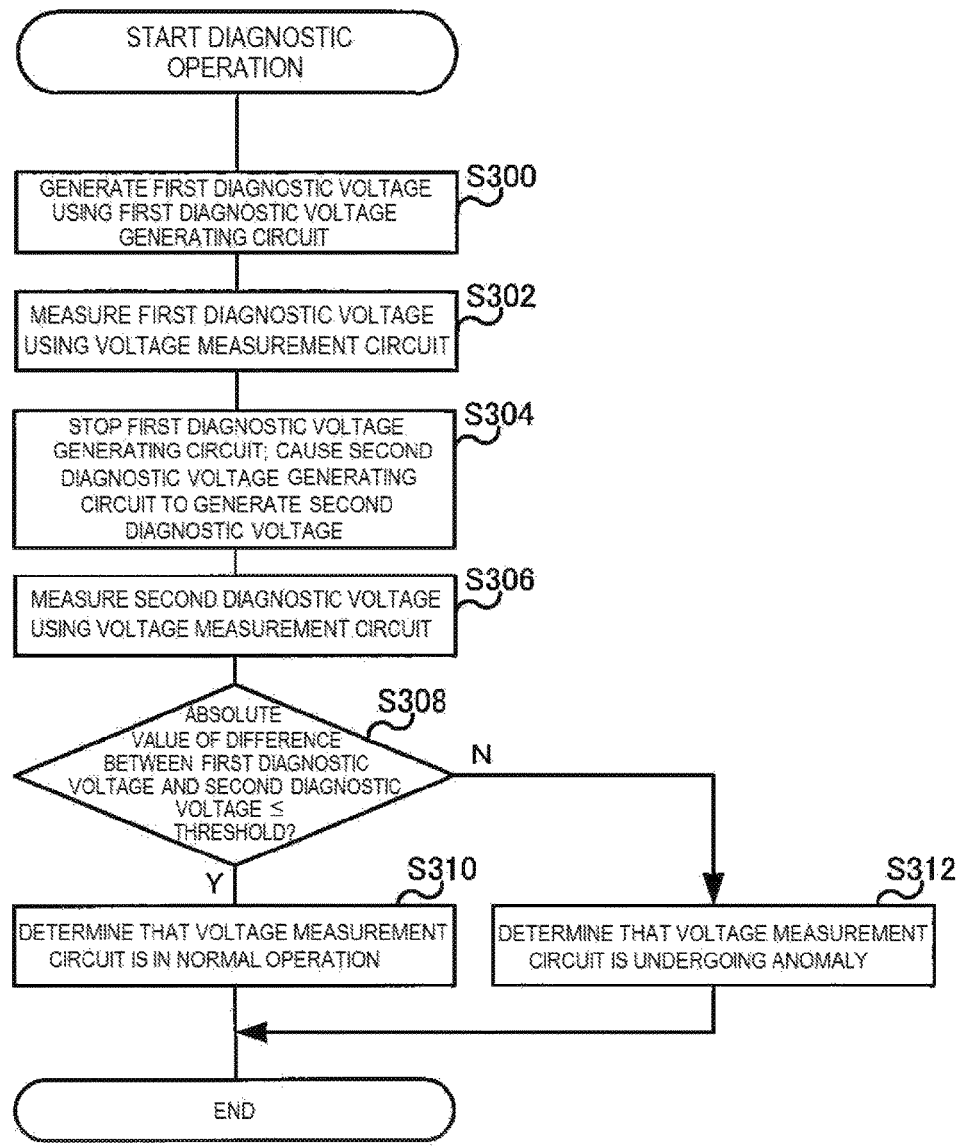
FIG. 7 is a flowchart showing on example of a diagnostic flow pertaining to an anomaly in a battery monitoring IC in a battery monitoring system of Embodiment 3.

Next, a diagnostic method for the battery monitoring IC 10 in the battery monitoring system 1 of the present embodiment will be described. FIG. 7 shows a flowchart representing one example of an operational flow for diagnosis of battery monitoring IC 10.

In the battery monitoring system 1 of the present embodiment, diagnosis of the battery monitoring IC 10 is performed using the first diagnostic voltage and the second diagnostic voltage generated by the first diagnostic voltage generating circuit 60 and the second diagnostic voltage generating circuit 62, and thus, there is no need to accumulate electric charge in the capacitor Clpf. Thus, the timing at which to perform the diagnostic operation may differ from or be the same as that of the embodiments above. It is preferable that measurement of the voltage of the battery cell Vc be performed after the diagnostic operation is performed and it is determined that the voltage measurement circuit 30_1 is in normal operation.

Before the start of the diagnostic operation, the control device 6 turns off all equalizing SWs 20, the cell selection SWs 26, and the S/H SWs 27.

Figure 8:
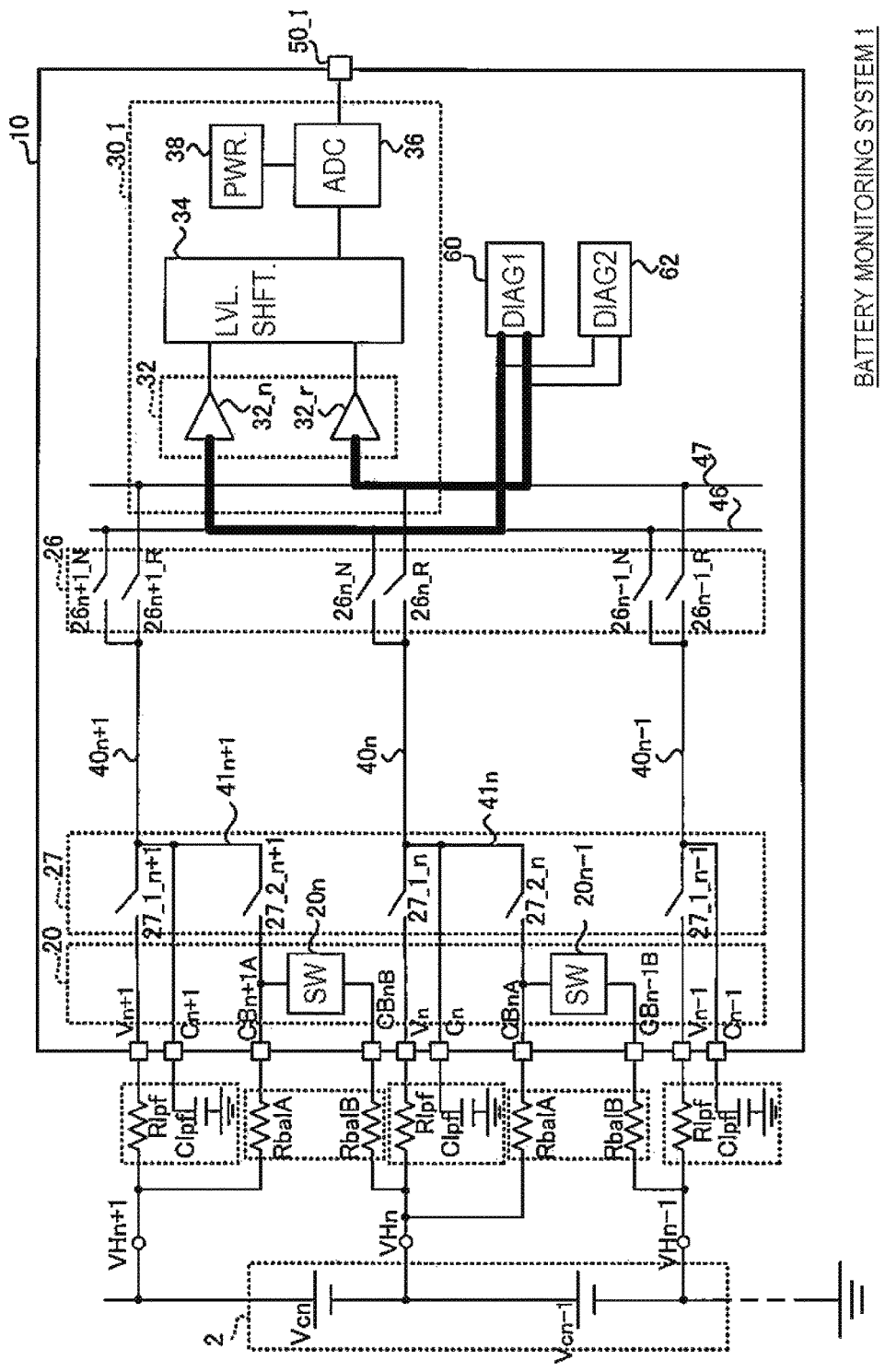
FIG. 8 shows current paths for when a first diagnostic voltage is measured by the voltage measurement circuit.

First, in step S300, the control device 6 causes the first diagnostic voltage generating circuit 60 to generate the first diagnostic voltage. In this manner, as shown in FIG. 8, the first diagnostic voltage is applied to the buffer amplifiers 32_n and 32_r.

In the following step S302, the voltage measurement circuit 30_1 measures the first diagnostic voltage. The voltage measurement circuit 30_1 outputs a digital signal based on the difference, outputted from the level shifter 34, between the output voltage from the buffer amplifier 32_n and the output voltage from the buffer amplifier 32_r.

Figure 9:
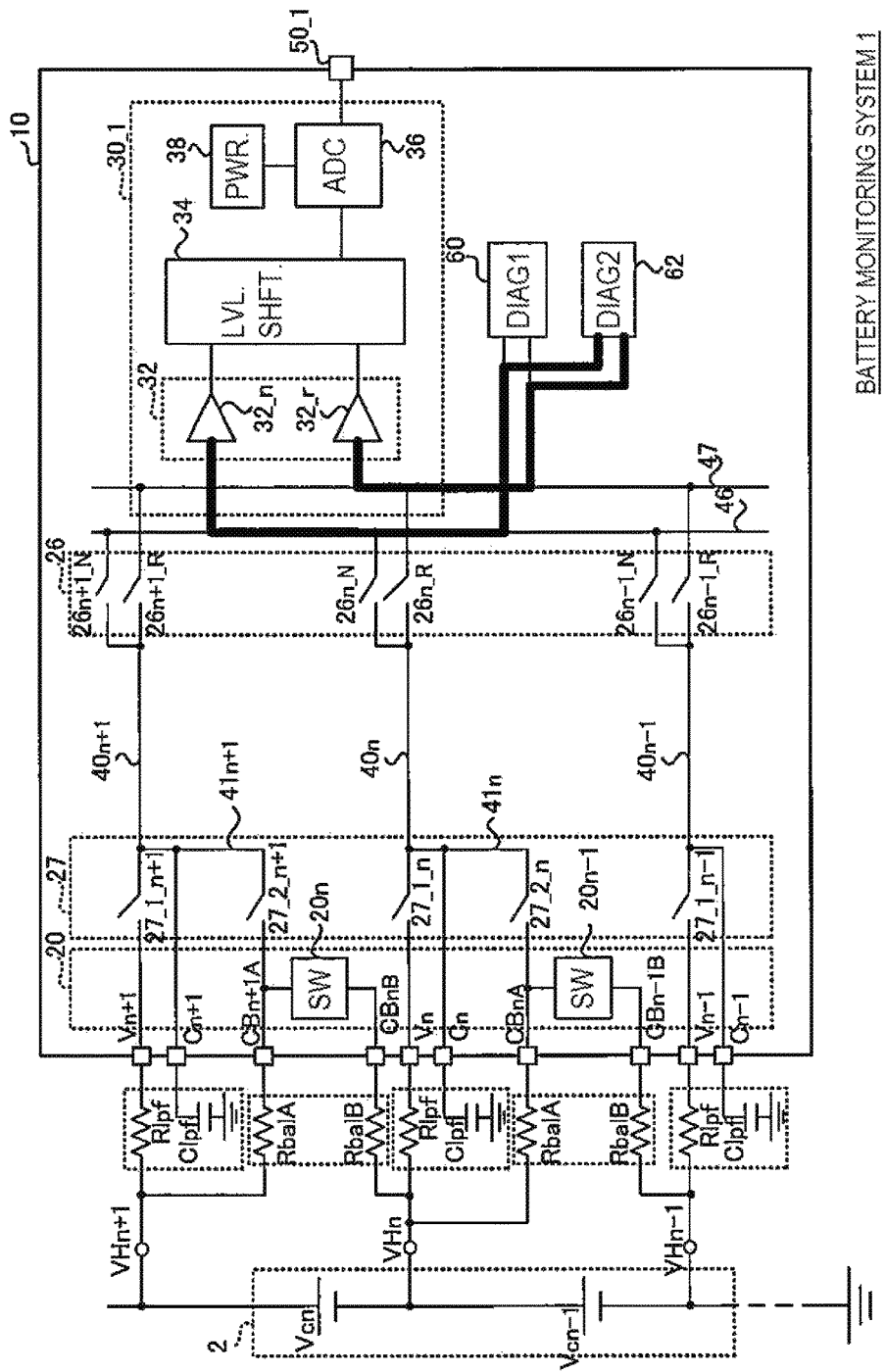
FIG. 9 shows current paths for when a second diagnostic voltage is measured by the voltage measurement circuit.

Next, in step S304, the control device 6 stops the first diagnostic voltage generating circuit 60 and causes the second diagnostic voltage generating circuit 62 to generate the second diagnostic voltage. In this manner, as shown in FIG. 9, the second diagnostic voltage is applied to the buffer amplifiers 32_n and 32_r.

In the following step S306, the voltage measurement circuit 30_1 measures the second diagnostic voltage. The voltage measurement circuit 30_1 outputs a digital signal based on the difference, outputted from the level shifter 34, between the output voltage from the buffer amplifier 32_n and the output voltage from the buffer amplifier 32_r.

In the next step S308, the control device 6 compares the first diagnostic voltage and the second diagnostic voltage measured by the voltage measurement circuit 30_1, and determines whether the absolute value of the difference therebetween is less than or equal to a threshold (includes 0V). If there is no anomaly, the difference between the first diagnostic voltage and the second diagnostic voltage measured by the voltage measurement circuit 30_1 would be 0V. In the present embodiment, a threshold that takes into account the impact of measurement errors and the like is set, and if the difference between the first diagnostic voltage and the second diagnostic voltage is less than or equal to the threshold, it is determined that the voltage measurement circuit 30_1 is in normal operation.

Thus, if the absolute value of the difference between the diagnostic voltages is less than or equal to the threshold, the process progresses to step S310, and the control device 6 determines that the voltage measurement circuit 30_1 is in normal operation, and then ends the diagnostic operation. On the other hand, if the absolute value of the difference between the diagnostic voltages exceeds the threshold, the process progresses to step S110, and the control device 6 determines that the voltage measurement circuit 30_1 is undergoing an anomaly, and then ends the diagnostic operation. Also, the control device 6 may naturally perform a predetermined operation (such as notification or the like of diagnostic results) in response to the results of the diagnostic operation.

When shipping the battery monitoring IC 10 or a module equipped with the battery monitoring IC 10, it is preferable that the measurement results of the first diagnostic voltage and the second diagnostic voltage be stored internally or externally to the battery monitoring IC 10. In such a case, by comparing the first diagnostic voltage and the second diagnostic voltage, measured by the voltage measurement circuit 30_1 when performing the diagnostic operation, with the stored first diagnostic voltage and second diagnostic voltage, it is possible to further increase diagnostic accuracy.

In this manner, similar to Embodiment 1, in the battery monitoring system 1 of the present embodiment, it is possible using one battery monitoring IC 10 to measure the voltage of each battery cell Vc included in the battery assembly 2 and to perform diagnosis relating to anomalies in the battery monitoring IC 10. Thus, according to the battery monitoring IC 10 of the present embodiment, it is possible to improve battery monitoring accuracy with a small circuit size.

Also, according to the battery monitoring IC 10 of the present embodiment, it is possible to perform diagnosis of the voltage measurement circuit 30_1 on the basis of the first diagnostic voltage generated by the first diagnostic voltage generating circuit 60 and the second diagnostic voltage generated by the second diagnostic voltage generating circuit 62. In the battery monitoring IC 10 of the present embodiment, the first diagnostic voltage generating circuit 60 and the second diagnostic voltage generating circuit 62 are used instead of the voltage measurement circuit 30_2 of Embodiment 1 or the voltage measurement circuit 30_3 of Embodiment 2, and thus, it is possible to reduce the chip size of the battery monitoring IC 10 of the present embodiment compared to the battery monitoring IC 10 of the embodiments above.

Embodiment 4

Figure 10:
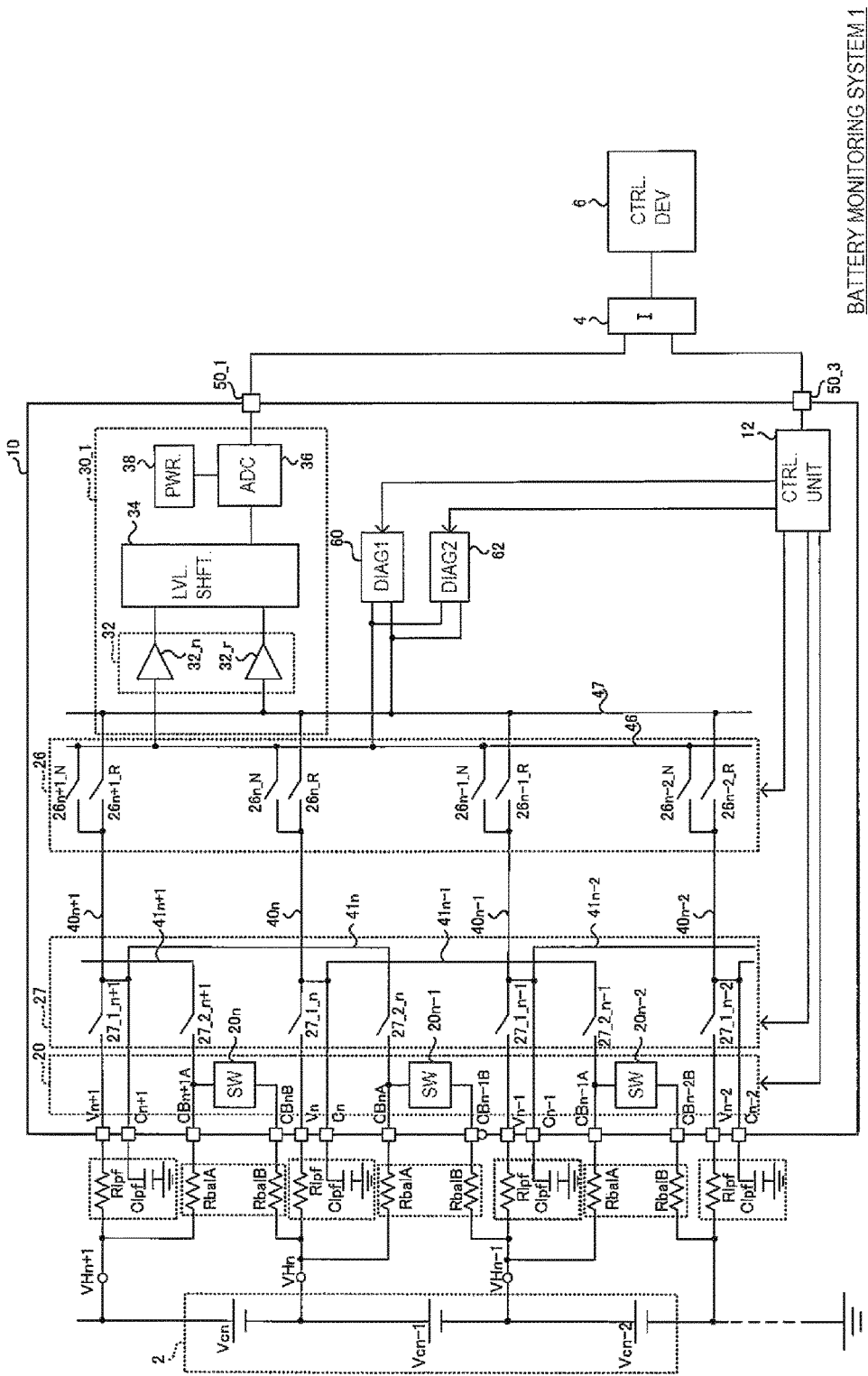
FIG. 10 is a schematic configuration drawing of an example of a battery monitoring system of Embodiment 4.

A battery monitoring system 1 of the present embodiment has a different configuration of the battery monitoring IC 10 than Embodiment 3. FIG. 10 shows a circuit diagram representing a configuration of an example of a battery monitoring system 1 of the present embodiment.

As shown in FIG. 10, the battery monitoring IC 10 of the present embodiment differs from the battery monitoring IC 10 of Embodiment 3 (see FIG. 6) in terms of the connection of the terminals C (terminals Cn−2 to Cn+1 of FIG. 10) and the terminals CBA (terminals CBn−1A to CBn+1A of FIG. 10). The terminal CBA of the battery monitoring IC 10 of the present embodiment is connected to the terminal Cn corresponding to an upper level battery cell Vc (one or more thereof) through the S/H SW 27. As shown in FIG. 10, for example, the terminal Cn+1 and the terminal CBnA are connected through the S/H SW 27_2_n. The terminal Cn and the terminal CBn−1A are connected through the S/H SW 27_2_n−1.

Next, a measurement method for the voltage of each battery cell Vc of the battery assembly 2 by the battery monitoring system 1 of the present embodiment will be described. Measurement of the voltage of the battery cells Vc is performed by the voltage measurement circuit 30_1.

The measurement method for battery voltage in the battery monitoring system 1 of the present embodiment differs from the measurement method for battery voltage in the battery monitoring system 1 of Embodiment 3 in terms of the method by which the electric charge based on the voltage of the battery cell Vc is accumulated in the capacitor Clpf.

When accumulating the electric charge based on the voltage of the battery cell Vc in the capacitor Clpf, the control device 6 turns on all S/H SWs 27_1 among the S/H SWs 27 using the control unit 12, and turns off all cell selection SWs 27_2 as well as all cell selection SWs 26. Also, the control device 6 turns off all equalizing SWs 20 using the control unit 12.

In this case, the voltage of the battery cell Vc is applied to the capacitor Clpf through the resistor Rlpf and the S/H SW 27_1. An electric charge based on the voltage of the battery cell Vc accumulates in the capacitor Clpf.

The measurement operation after the electric charge based on the voltage of the battery cell Vc is accumulated in the capacitor Clpf is similar to that of Embodiment 3, and thus, descriptions thereof are omitted.

Next, a diagnostic method for the battery monitoring IC 10 in the battery monitoring system 1 of the present embodiment will be described. In the battery monitoring system 1 of the present embodiment, it is possible to perform two types of diagnoses of anomalies: diagnosis of an anomaly in the voltage measurement circuit 30_1 of the battery monitoring IC 10 (hereinafter referred to as the "first diagnosis"); and diagnosis of an anomaly from a terminal connected to each battery cell Vc to the cell selection SW 26 (hereinafter referred to as the "second diagnosis"). Of these, the first diagnosis is similar to the diagnostic operation of Embodiment 3 (see FIG. 7, etc.), and thus, descriptions thereof are omitted, and only the second diagnosis will be described.

Figure 11:
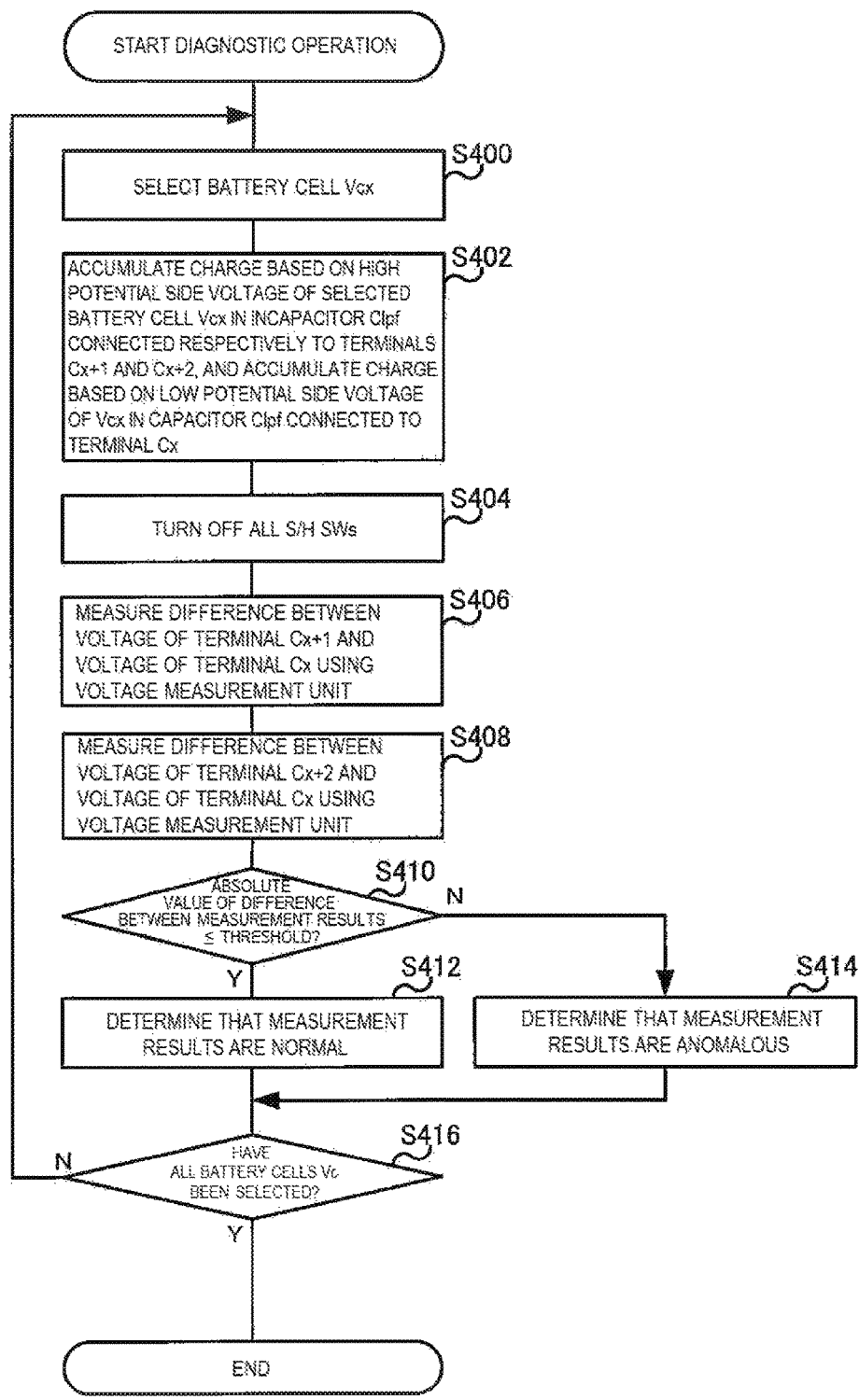
FIG. 11 is a flowchart showing on example of a diagnostic flow pertaining to an anomaly in a battery monitoring IC in a battery monitoring system of Embodiment 4.

FIG. 11 shows a flowchart representing one example of an operational flow for the second diagnostic operation of a battery monitoring IC 10 of the present embodiment.

The timing at which the second diagnostic operation is performed may be the same as or different from the timing at which the first diagnostic operation is performed. Step S402 (details to be described later) of the second diagnostic operation may be performed during the first diagnostic operation.

Before the start of the second diagnostic operation, the control device 6 turns off all equalizing SWs 20, S/H SWs 27, and cell selection SWs 26.

First, in step S400, the control device 6 selects one battery cell Vcx (x being an integer of 1 to n) from among the battery cells Vc of the battery assembly 2. A case in which the battery cell Vcn−1 is selected will be described below as a specific example.

In the next step S402, the control device 6 causes an electric charge based on the voltage of the high potential side of the selected battery cell Vcx to accumulate in the capacitor Clpf connected to the terminal Cx+1 and the capacitor Clpf connected to the terminal Cx+2. Additionally, the control device 6 causes an electric charge based on the voltage of the low potential side of the selected battery cell Vcx to accumulate in the capacitor Clpf connected to the terminal Cx.

Figure 12:
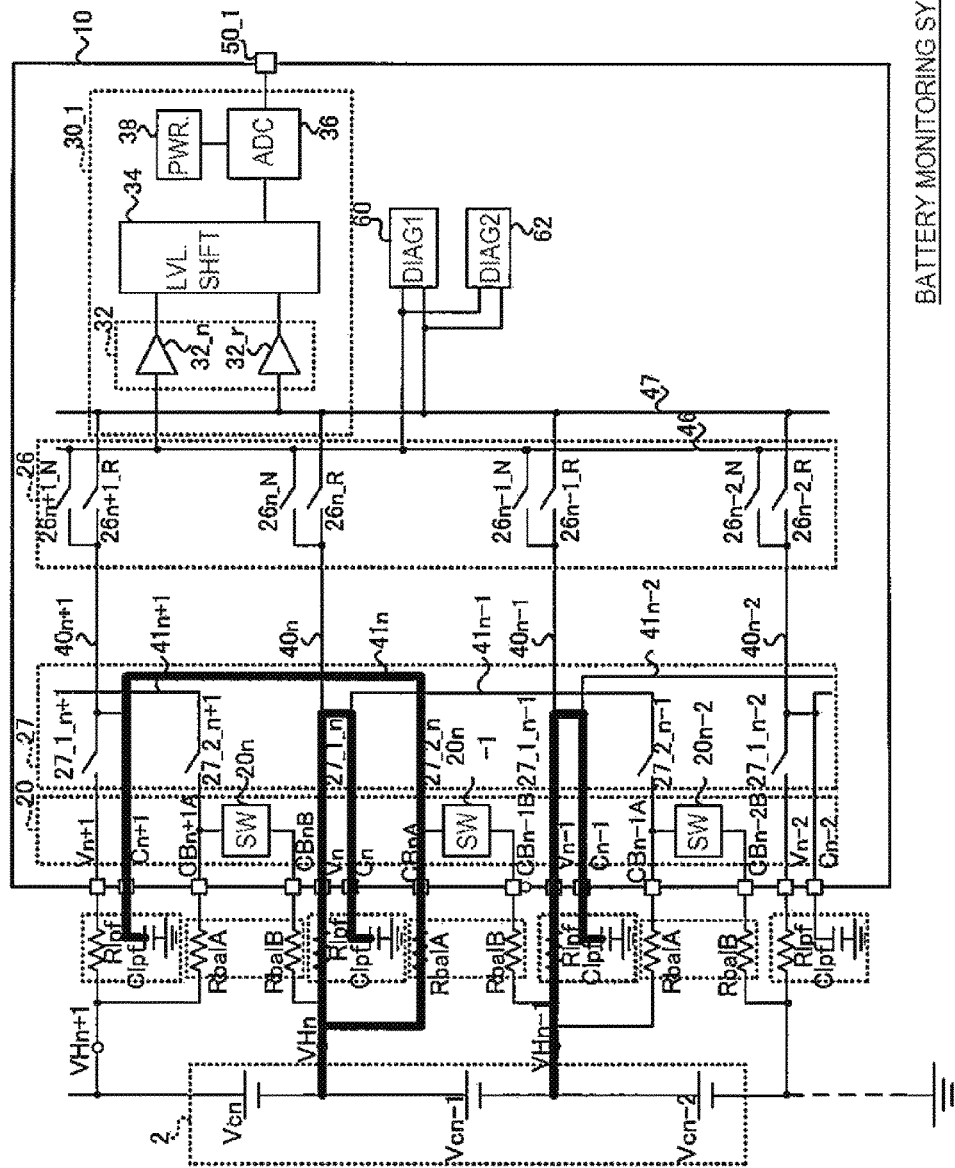
FIG. 12 shows a current path for when charge is caused to accumulate in a capacitor during a second diagnostic operation of Embodiment 4.

If the battery cell Vcn−1 is selected, then as shown in FIG. 12, the control device 6 causes the S/H SWs 27_2_$n$ and 2_1_$n$ to be turned on. In this manner, the electric charge based on the voltage of the high potential side of the selected battery cell Vcn−1 is caused to accumulate in the capacitor Clpf connected to the terminal Cn+1 and the capacitor Clpf connected to the terminal Cn. Also, as shown in FIG. 12, the control device 6 causes the S/H SWs 27_1_$n$−1 to be turned on. In this manner, the electric charge based on the voltage of the low potential side of the battery cell Vcn−1 is caused to accumulate in the capacitor Clpf connected to the terminal Cn−1.

If the top battery cell Vc (Vcn in the present embodiment) is selected in step S400, there is no terminal corresponding to a terminal Cx+2. Thus, if the top battery cell Vc is selected, then a terminal C (any terminal) other than the terminals Cx+1 and Cx is used instead of the terminal Cx+2, and an electric charge based on the voltage of the high potential side of the battery cell Vc is caused to accumulate in the capacitor Clpf connected to the terminal C. In step S408, the voltage measurement circuit 30_1 measures the difference between the voltage of the terminal C and the voltage of the terminal Cx.

If the high potential side voltage of the battery cell Vcn is caused to accumulate in the capacitor Clpf, for example, then the S/H SW 27_1_$n$+1 is turned on causing the electric charge to accumulate in the capacitor Clpf connected to the terminal Cn+1, and the cell selection SWs 26$n$+1_N and 26$n$−2_N are turned on causing the electric charge to accumulate in the capacitor Clpf connected to the terminal Cn−2.

After the electric charge has accumulated in the capacitor Clpf, the control device 6 in the next step S404 turns all S/H SWs 22 on.

In the following step S406, the voltage measurement circuit 30_1 measures the difference between the voltage of the terminal Cx+1 and the voltage of the terminal Cx.

Figure 13:
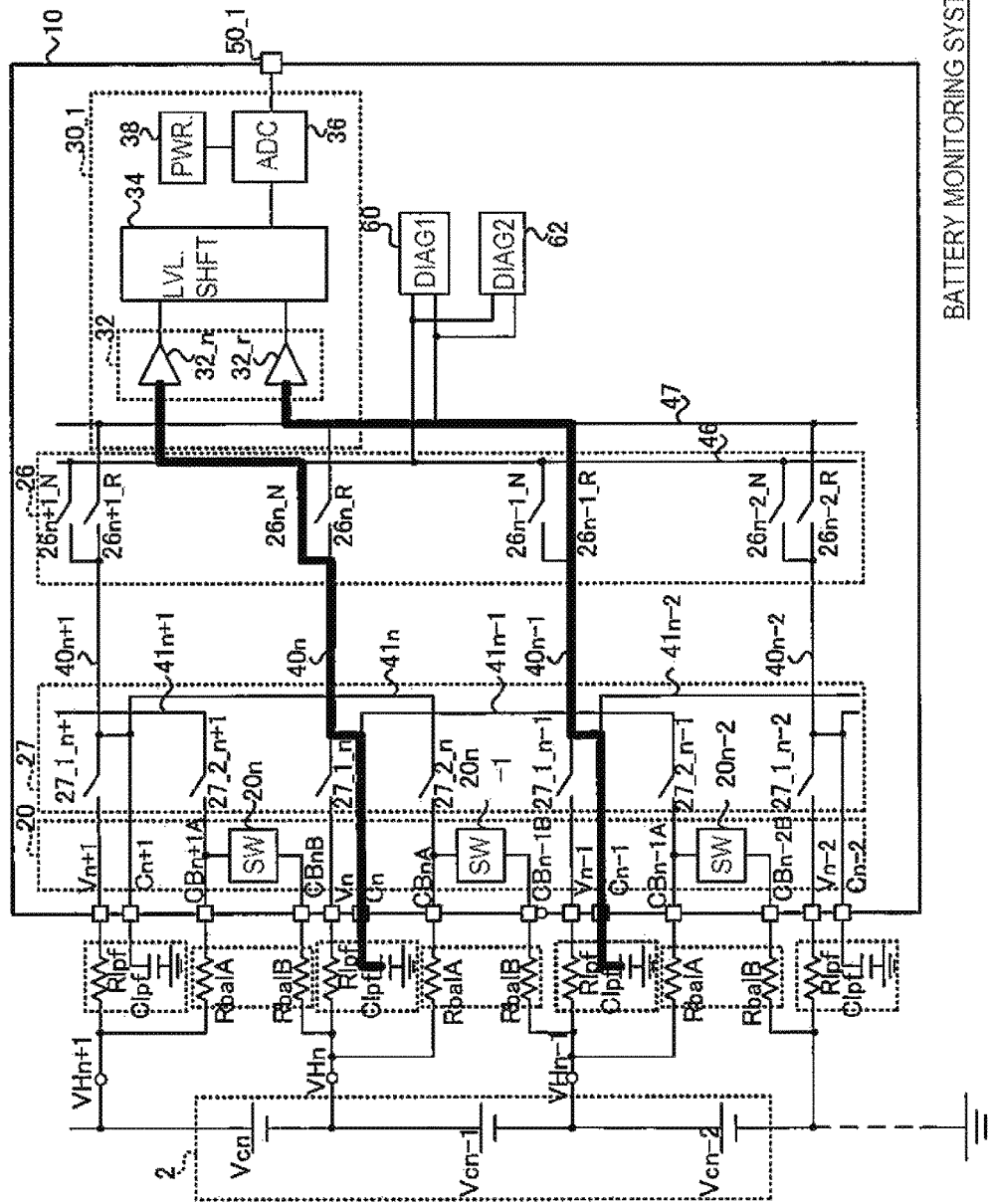
FIG. 13 shows a current path for when a difference between the voltage of a terminal Cx+1 and the voltage of a terminal Cx is measured.

If the battery cell Vcn−1 is selected, then as shown in FIG. 13, the control device 6 causes the cell selection SWs 26$n$_N and 26$n$−1_R to be turned on. In this manner, as shown in FIG. 13, the voltage of the terminal Cn is applied to the buffer amplifier 32_$n$ of the voltage measurement circuit 30_1. Also, the voltage of the terminal Cn−1 is applied to the buffer amplifier 32_$r$ of the voltage measurement circuit 30_1. The voltage measurement circuit 30_1 outputs the difference between the voltages of the terminals Cn and Cn−1 among the terminals C as measurement results to the control device 6.

In the following step S408, the voltage measurement circuit 30_1 measures the difference between the voltage of the terminal Cx+2 and the voltage of the terminal Cx.

Figure 14:
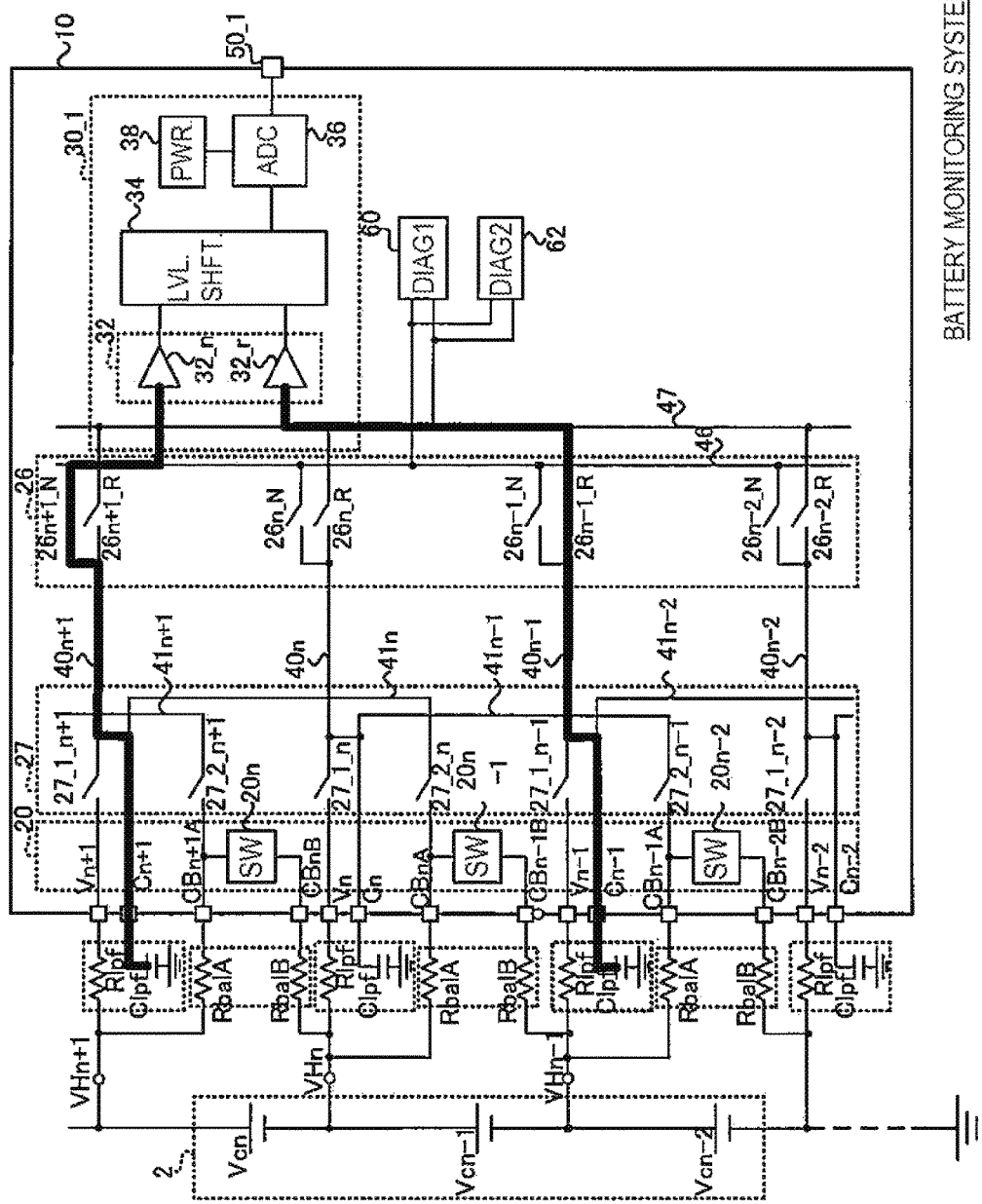
FIG. 14 shows a current path for when a difference between the voltage of a terminal Cx+2 and the voltage of a terminal Cx is measured.

If the battery cell Vcn−1 is selected, then as shown in FIG. 14, the control device 6 turns off the cell selection SWs 26$n$_N and turns on the cell selection SWs 26$n$+1_N. In this manner, as shown in FIG. 14, the voltage of the terminal Cn+1 is applied instead of the voltage of the terminal Cn to the buffer amplifier 32_$n$ of the voltage measurement circuit 30_1. The voltage measurement circuit 30_1 outputs the difference between the voltages of the terminals Cn+1 and Cn−1 among the terminals C as measurement results to the control device 6.

In the next step S410, the control device 6 compares the measurement results from step S406 with the measurement results from step S408, and determines whether the absolute value of the difference therebetween is less than or equal to a threshold (includes 0V).

Under normal operation, the amount of electric charge accumulated in the capacitor Clpf connected to the terminal Cn+1 is equal to the amount of electric charge accumulated in the capacitor Clpf connected to the terminal Cn, and thus, the voltage of the terminal Cn+1 is equal to the voltage of the terminal Cn. Thus, when the measurement results are normal, the difference between the measurement results would be at 0V. In the present embodiment, a threshold that takes into account the impact of measurement errors and the like is set, and if the difference between the measurement results is less than or equal to the threshold, it is determined that the measurement results are normal.

Thus, if the absolute value of the difference between the measurement results is less than or equal to the threshold, the process progresses to step S412, and the control device 6 issues a diagnosis that the area from the terminal connected to the selected battery cell Vcx to the cell selection SW 26 is normal. On the other hand, if the absolute value of the difference between the measurement results exceeds the threshold, the process progresses to step S414, and the control device 6 issues a diagnosis that there is an anomaly in the area from the terminal connected to the selected battery cell Vcx to the cell selection SW 26.

In the following step S416 the control device 6 determines whether all battery cells Vc have been selected.

If there are battery cells Vc that have not yet been selected, the process returns to step S400 and the operation described above is repeated. In this case, the switches that were turned on in step S408 are turned off before the process returns to step S400.

On the other hand, if all battery cells Vc have been selected, then the second diagnostic operation ends.

Also, the control device 6 may naturally perform a predetermined operation (such as notification or the like of diagnostic results) in response to the results of the second diagnostic operation.

In this manner, similar to Embodiment 1, in the battery monitoring system 1 of the present embodiment, it is possible using one battery monitoring IC 10 to measure the voltage of each battery cell Vc included in the battery assembly 2 and to perform diagnosis relating to anomalies in the battery monitoring IC 10. Thus, according to the battery monitoring IC 10 of the present embodiment, it is possible to improve battery monitoring accuracy with a small circuit size.

According to the battery monitoring IC 10 of the present embodiment, it is possible to perform two types of diagnoses of anomalies: diagnosis of an anomaly in the voltage measurement circuit 30_1; and diagnosis of an anomaly from a terminal connected to each battery cell Vc to the cell selection SW 26.

Embodiment 5

Figure 15:
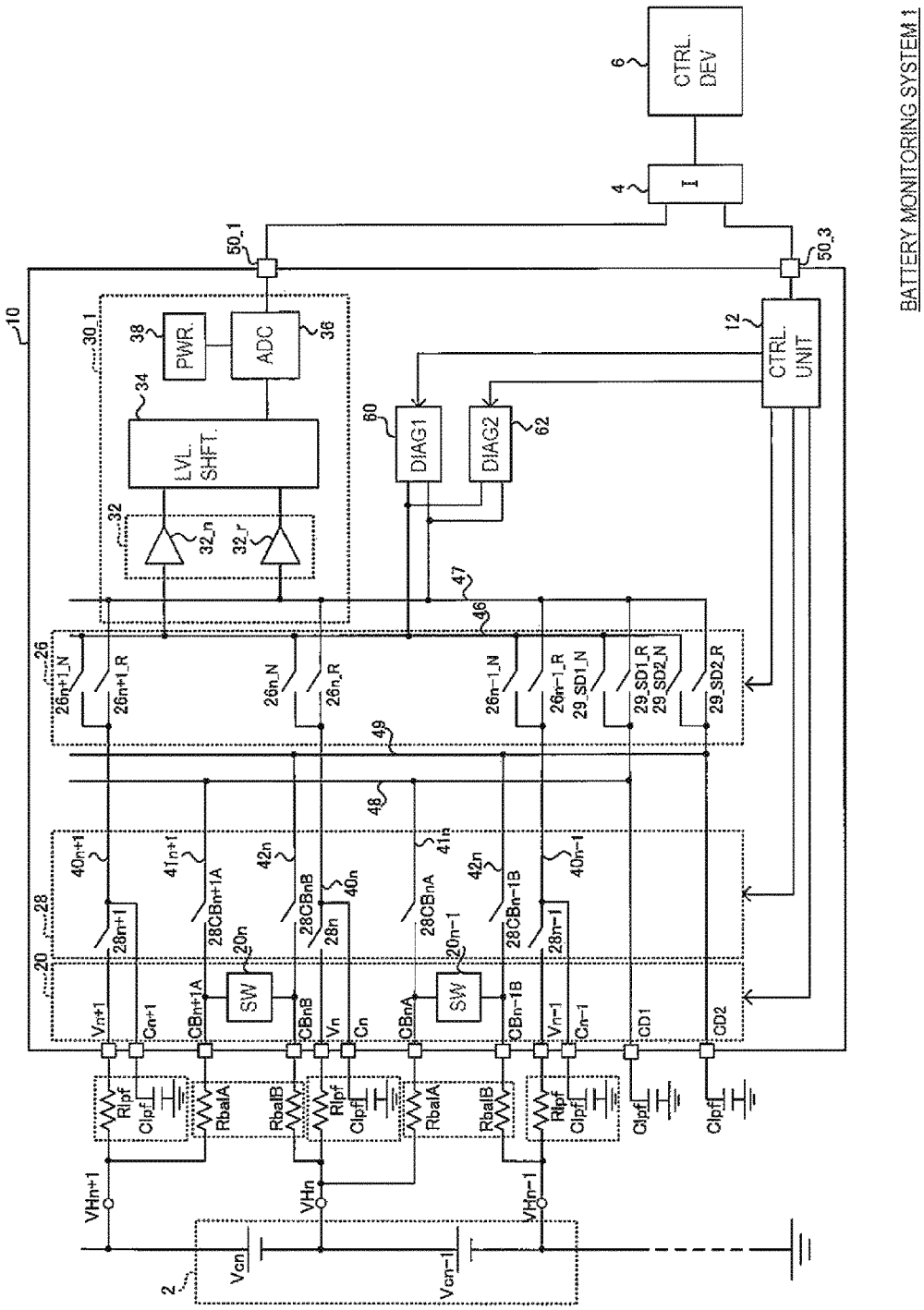
FIG. 15 is a schematic configuration drawing of an example of a battery monitoring system of Embodiment 5.

A battery monitoring system 1 of the present embodiment has a different configuration of the battery monitoring IC 10 than the embodiments above. FIG. 15 shows a circuit diagram representing a configuration of an example of a battery monitoring system 1 of the present embodiment.

As shown in FIG. 15, the battery monitoring IC 10 of the present embodiment includes an S/H SW 28 and signal lines 48 and 49 instead of the S/H SW 22 and signal lines 44 and 45 of the battery monitoring IC 10 (see FIG. 1) of Embodiment 1. Also, the battery monitoring IC 10 of the present embodiment does not include the cell selection SWs 24, which the battery monitoring IC 10 of Embodiment 1 includes.

The connection of the battery monitoring IC 10 to the battery cell Vcn will be described as a specific example. The high potential side of the battery cell Vcn is connected to the terminal Vn+1 of the battery monitoring IC 10 through the resistor Rlpf. The terminal Vn+1 is connected to one terminal of the S/H SW 28n+1, and the other terminal of the S/H SW 28n+1 is connected to the signal line 40n+1. The other terminal of the S/H SW 28n+1 is connected through the terminal Cn+1 to one electrode of the capacitor Clpf provided to the outside of the battery monitoring IC 10.

The high potential side of the battery cell Vcn is connected to the terminal CBn+1A of the battery monitoring IC 10 through the resistor RbalA. The signal line 41n+1 is connected to the terminal CBn+1A. The signal line 41n+1 is connected to the signal line 48 through the cell selection SW 28CBn+1A.

The low potential side of the battery cell Vcn is connected to the terminal CBnB of the battery monitoring IC 10 through the resistor RbalB. The signal line 42n is connected to the terminal CBnB. The signal line 42n is connected to the signal line 49 through the cell selection SW 28CBnB.

Also, as shown in FIG. 15, the battery monitoring IC 10 of the present embodiment includes a first diagnostic voltage generating circuit 60 and second diagnostic voltage generating circuit 62, similar to the battery monitoring IC 10 (see FIGS. 6 and 10) of Embodiments 3 and 4.

Furthermore, as shown in FIG. 15, the battery monitoring IC 10 of the present embodiment includes a terminal CD1 connected to the capacitor Clpf provided outside of the battery monitoring IC 10, and a terminal CD2 connected to the capacitor Clpf. Also, the cell selection SWs 26 further include cell selection SWs 29_SD1_N, 29_SD1_R, 29_SD2_N, and 29_SD2_R.

The terminal CD1 is connected to the signal line 48. The terminal CD1 is connected to the signal line 46 through the cell selection SW 29_SD1_N, and is connected to the signal line 47 through the cell selection SW 29_SD1_R. Meanwhile, the terminal CD2 is connected to the signal line 49. The terminal CD2 is connected to the signal line 46 through the cell selection SW 29_SD2_N, and is connected to the signal line 47 through the cell selection SW 29_SD2_R.

Next, a measurement method for the voltage of each battery cell Vc of the battery assembly 2 by the battery monitoring system 1 of the present embodiment, and a diagnostic method for the battery monitoring IC 10 in the battery monitoring system 1 of the present embodiment will be described.

A measurement method for the battery voltage in the battery monitoring system 1 of the present embodiment is similar to that of the battery monitoring system 1 of Embodiment 1, and thus, descriptions thereof are omitted.

The diagnostic method of the battery monitoring IC 10 in the battery monitoring system 1 of the present embodiment has two diagnostic methods including a diagnostic method for a first diagnosis and a diagnostic method for a second diagnosis, for performing diagnosis of two types of anomalies, similar to Embodiment 4. Of these, the diagnostic method for the first diagnosis is similar to the diagnostic operation of Embodiment 3 (see FIG. 7, etc.), and thus, descriptions thereof are omitted, and only the diagnostic method for the second diagnosis will be described.

Figure 16:
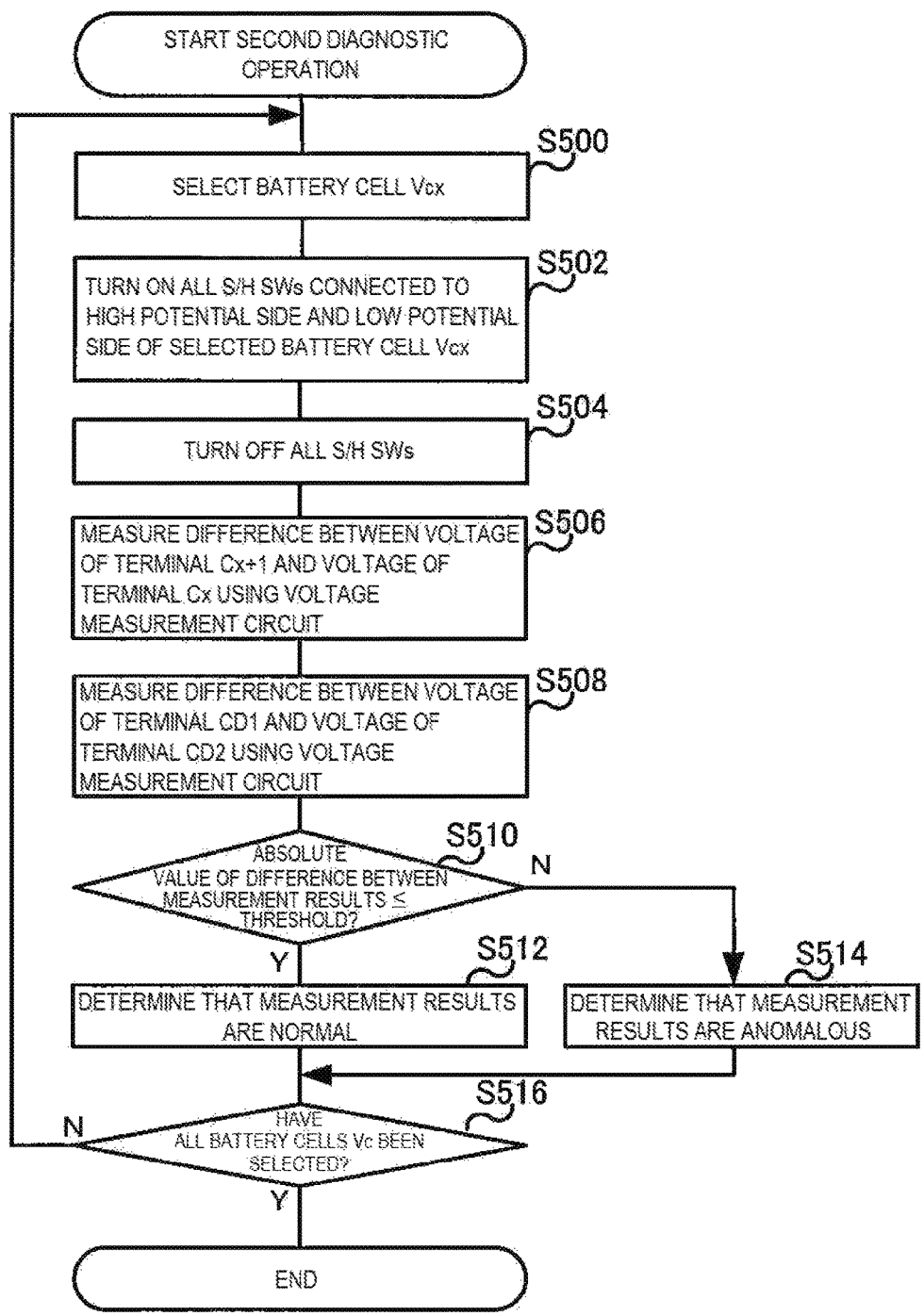
FIG. 16 is a flowchart showing on example of a diagnostic flow pertaining to an anomaly in a battery monitoring IC in a battery monitoring system of Embodiment 5.

FIG. 16 shows a flowchart representing one example of an operational flow for the second diagnostic operation of a battery monitoring IC 10 of the present embodiment.

The timing at which the second diagnostic operation is performed may be the same as or different from the timing at which the first diagnostic operation is performed, similar to what was described in Embodiment 3. Step S502 (details to be described later) of the second diagnostic operation may be performed during the first diagnostic operation.

Before the start of the second diagnostic operation, the control device 6 turns off all equalizing SWs 20, cell selection SWs 26, and the S/H SWs 28.

First, in step S500, the control device 6 selects one battery cell Vcx (x being an integer of 1 to n) from among the battery cells Vc of the battery assembly 2. A case in which the battery cell Vcn is selected will be described below as a specific example.

In the next step S502, the control device 6 turns on all S/H SWs 28 connected to the high potential side and the low potential side of the selected battery cell Vcx. In this manner, the electric charge based on the voltage of the high potential side of the selected battery cell Vcx is caused to accumulate in the capacitor Clpf connected to the terminal Cx+1 and the capacitor Clpf connected to the terminal CD1. Additionally, the control device 6 causes an electric charge based on the voltage of the low potential side of the battery cell Vcx to accumulate in the capacitor Clpf connected to the terminal Cx and the capacitor Clpf connected to the terminal CD+2.

Figure 17:
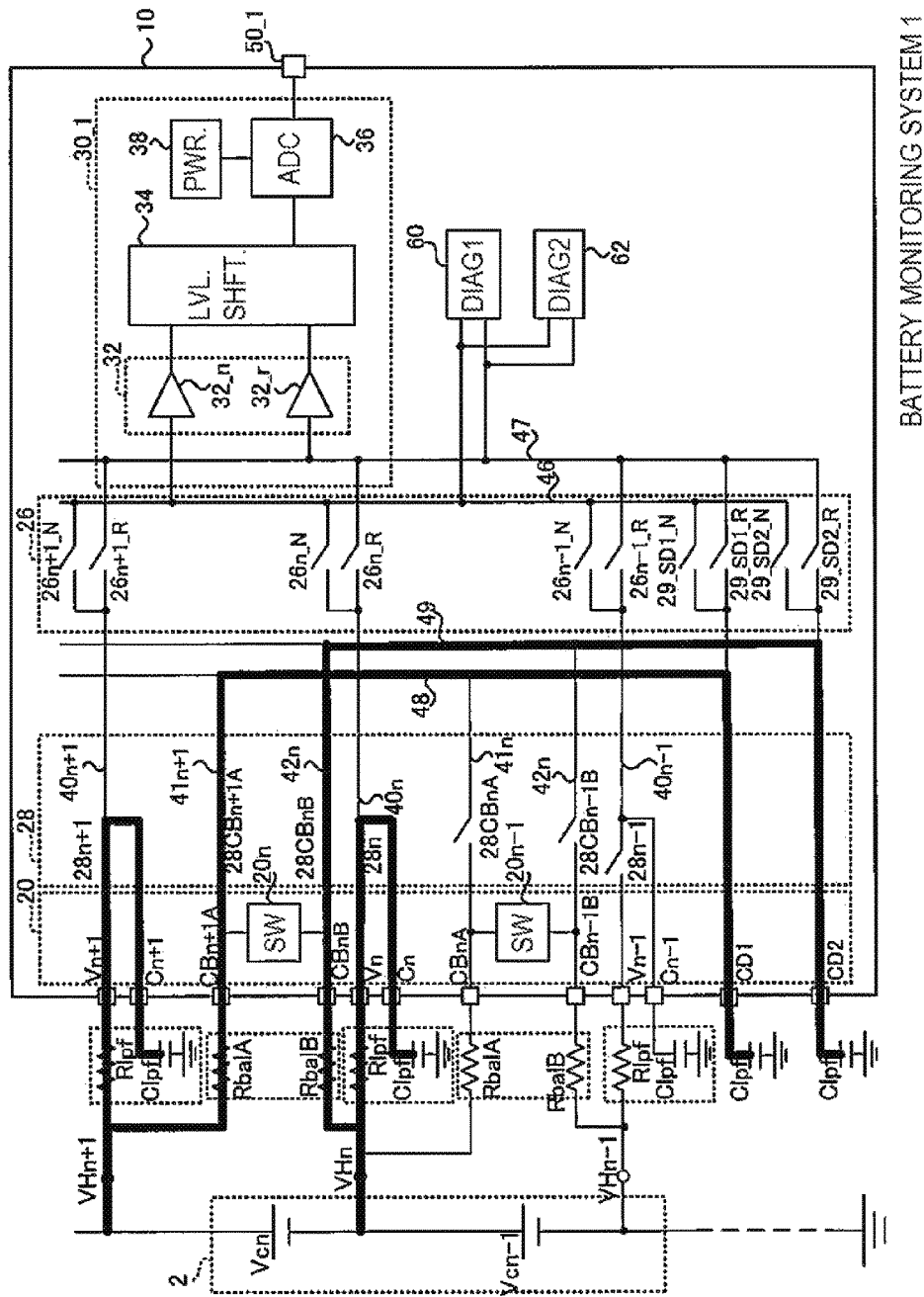
FIG. 17 shows a current path for when charge is caused to accumulate in a capacitor during a second diagnostic operation of Embodiment 5.

If the battery cell Vcn is selected, then as shown in FIG. 17, the control device 6 causes the S/H SW 28n+1 connected to the high potential side of the battery cell Vcn to be turned on. In this manner, the electric charge based on the voltage of the high potential side of the battery cell Vcn is caused to accumulate in the capacitor Clpf connected to the terminal Cn+1, through the terminal Vn+1 and the S/H SW 28n+1. Also, the control device 6 causes the S/H SWs 28CBn+1A connected to the high potential side of the battery cell Vcn to be turned on. In this manner, the electric charge based on the voltage of the high potential side of the battery cell Vcn is caused to accumulate in the capacitor Clpf connected to the terminal CD1, through the terminal CBn+1A, the signal line 41n+1, and the signal line 48.

Also, as shown in FIG. 17, the control device 6 causes the S/H SWs 28n to be turned on. In this manner, the electric charge based on the voltage of the low potential side of the battery cell Vcn is caused to accumulate in the capacitor Clpf connected to the terminal Cn, through the terminal Vn and the S/H SW 28*n*. Also, the control device 6 causes the S/H SWs 28CBnB connected to the low potential side of the battery cell Vcn to be turned on. In this manner, the electric charge based on the voltage of the low potential side of the battery cell Vcn is caused to accumulate in the capacitor Clpf connected to the terminal CD2, through the terminal CBnB, the signal line 42*n*, and the signal line 49.

After the electric charge has accumulated in the capacitor Clpf, the control device 6 in the next step S504 turns all S/H SWs 28 on.

In the following step S506, the voltage measurement circuit 30_1 measures the difference between the voltage of the terminal Cx+1 and the voltage of the terminal Cx.

Figure 18:
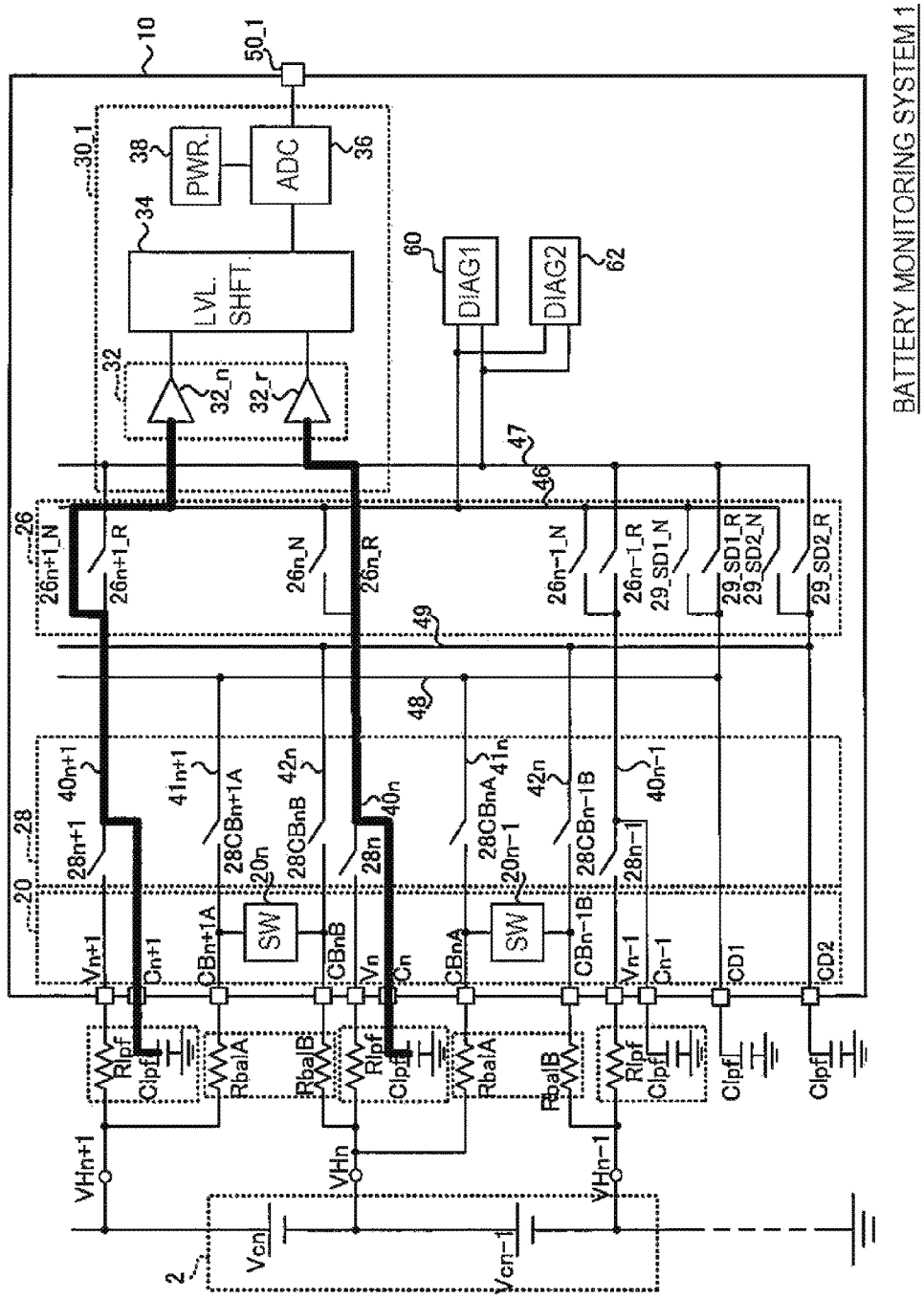
FIG. 18 shows a current path for when a difference between the voltage of a terminal Cx+1 and the voltage of a terminal Cx is measured.

If the battery cell Vcn is selected, then as shown in FIG. 18, the control device 6 causes the cell selection SWs 26*n*+1_N and 26*n*R to be turned on. In this manner, as shown in FIG. 18, the voltage of the terminal Cn+1 is applied to the buffer amplifier 32_*n* of the voltage measurement circuit 30_1. Also, the voltage of the terminal Cn is applied to the buffer amplifier 32_*r* of the voltage measurement circuit 30_1. The voltage measurement circuit 30_1 outputs the difference between the voltages of the terminals Cn+1 and Cn among the terminals C as measurement results to the control device 6.

In the following step S508, the voltage measurement circuit 30_1 measures the difference between the voltage of the terminal CS1 and the voltage of the terminal CD2.

Figure 19:
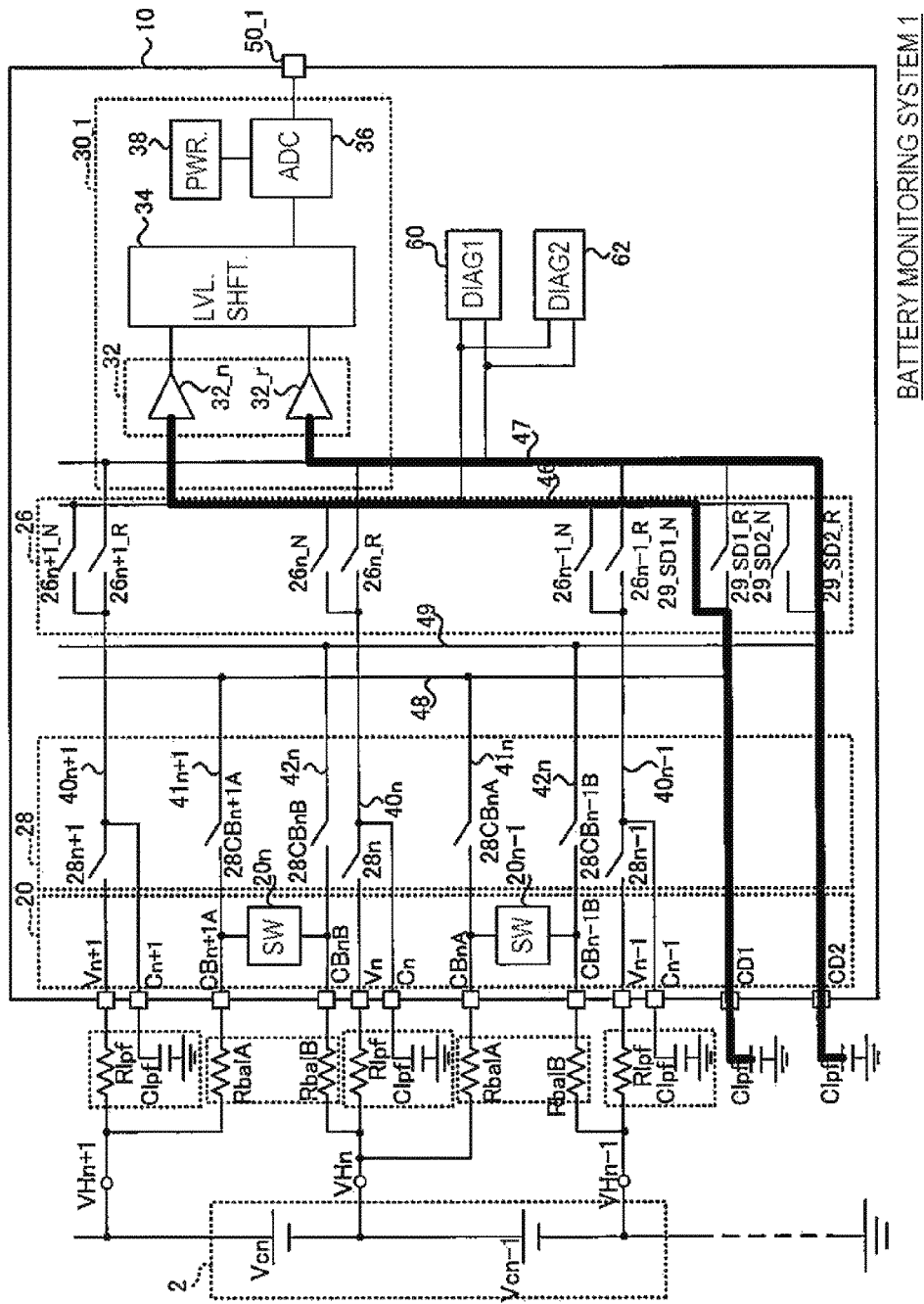
FIG. 19 shows a current path for when a difference between the voltage of a terminal Cx+2 and the voltage of a terminal Cx is measured.

If the battery cell Vcn is selected, then as shown in FIG. 19, the control device 6 turns off all S/H SWs 28 and turns on the cell selection SWs 29_SD1_N and 29_SD2_R to be turned on. In this manner, as shown in FIG. 19, the voltage of the terminal CD1 is applied to the buffer amplifier 32_*n* of the voltage measurement circuit 30_1, and the voltage of the terminal CD2 is applied to the buffer amplifier 32_*r*. The voltage measurement circuit 30_1 outputs the difference between the voltages of the terminals CD1 and CD2 as measurement results to the control device 6.

In the next step S510, the control device 6 compares the measurement results from step S506 with the measurement results from step S508, and determines whether the absolute value of the difference therebetween is less than or equal to a threshold (includes 0V).

Under normal operation, the amount of electric charge accumulated in the capacitor Clpf connected to the terminal Cn+1 is equal to the amount of electric charge accumulated in the capacitor Clpf connected to the terminal CD1, and thus, the voltage of the terminal Cn+1 is equal to the voltage of the terminal CD1. Also, the amount of electric charge accumulated in the capacitor Clpf connected to the terminal Cn is equal to the amount of electric charge accumulated in the capacitor Clpf connected to the terminal CD2, and thus, the voltage of the terminal Cn+1 is equal to the voltage of the terminal CD1. Thus, when the measurement results are normal, the difference between the measurement results would be at 0V. In the present embodiment, a threshold that takes into account the impact of measurement errors and the like is set, and if the difference between the measurement results is less than or equal to the threshold, it is determined that the measurement results are normal.

Thus, if the absolute value of the difference between the measurement results is less than or equal to the threshold, the process progresses to step S512, and the control device 6 issues a diagnosis that the area from the terminal connected to the selected battery cell Vcx to the cell selection SW 26 is normal. On the other hand, if the absolute value of the difference between the measurement results exceeds the threshold, the process progresses to step S514, and the control device 6 issues a diagnosis that there is an anomaly in the area from the terminal connected to the selected battery cell Vcx to the cell selection SW 26.

In the following step S516 the control device 6 determines whether all battery cells Vc have been selected.

If there are battery cells Vc that have not yet been selected, the process returns to step S500 and the operation described above is repeated. In this case, the switches that were turned on in step S508 are turned off before the process returns to step S500.

On the other hand, if all battery cells Vc have been selected, then the second diagnostic operation ends.

Also, the control device 6 may naturally perform a predetermined operation (such as notification or the like of diagnostic results) in response to the results of the second diagnostic operation. In this manner, similar to Embodiment 1, in the battery monitoring system 1 of the present embodiment, it is possible using one battery monitoring IC 10 to measure the voltage of each battery cell Vc included in the battery assembly 2 and to perform diagnosis relating to anomalies in the battery monitoring IC 10. Thus, according to the battery monitoring IC 10 of the present embodiment, it is possible to improve battery monitoring accuracy with a small circuit size.

In this manner, according to the battery monitoring IC 10 of the present embodiment, similar to Embodiment 4, it is possible to perform two types of diagnoses for anomalies: diagnosis of an anomaly in the voltage measurement circuit 30_1; and diagnosis of an anomaly from a terminal connected to each battery cell Vc to the cell selection SW 26.

Also, in the battery monitoring IC 10 of the present embodiment, the capacitor Clpf connected to the terminal CD1 used specifically for the second diagnosis and the capacitor Clpf connected to the terminal CD2 are used. Thus, unlike the battery monitoring IC 10 of Embodiment 4, even if the topmost battery cell Vc were selected, a similar method for diagnosis can be used as when another battery cell Vc is selected. Thus, the diagnostic method for the second diagnosis is simpler than in Embodiment 4.

Also, it is possible to reduce the time constant of the LPF constituted of the resistor RLpf and the capacitor Clpf, enabling reduction of the diagnostic time.

As described above, in the battery monitoring system 1 of each embodiment, it is possible using one battery monitoring IC 10 to measure the voltage of each battery cell Vc included in the battery assembly 2 and to perform diagnosis relating to anomalies in the battery monitoring IC 10.

Thus, according to the battery monitoring system 1 including the battery monitoring IC 10 of the present embodiment, it is possible to improve battery monitoring accuracy with a small circuit size.

In the embodiments above, a case was described in which the voltage between the above-mentioned terminals was measured once during the measurement method and the diagnostic method when measuring the voltage of the battery cells Vc and performing diagnosis, but measurement of the voltage may be performed a plurality of times each in order to improve the accuracy of measurement and diagnosis.

For example, when measuring the voltage of the battery cell Vcn, the difference between the voltage of the terminal Cn+1 and the voltage of the terminal Cn is measured, and during the first measurement, the cell selection SWs 26*n*+1_N and 26*n*_R are turned on and the voltage difference is measured by the voltage measurement circuit 30_1. Also, during the second measurement, the cell selection SWs 26*n*+1_R and 26*n*_N are turned on and the voltage difference is measured by the voltage measurement circuit 30_1. In the control device 6, an average of the absolute values of the first measurement results and the second measurement results may be calculated, with the calculated average being designated as the difference between the voltage of the terminal Cn+1 and the voltage of the terminal Cn (voltage of the battery cell Vc).

Also, in the embodiments above, when determining whether the diagnostic operation is progressing normally, the control device 6 determined whether the difference in measurement results was within a threshold, but the determination method is not limited thereto. Whether the operation is progressing normally may be determined on the basis of a ratio between the measurement results, for example.

Additionally, in the embodiments above, a case was described in which the level shifter 34 of the voltage measurement circuit 30 outputs the difference between the voltage inputted from the buffer amplifier 32_n and the voltage inputted from the buffer amplifier 32_r as a voltage relative to ground, but the level shifter 34 is not limited thereto, and may use a voltage other than ground as a reference, for example.

Other configurations, operations, and the like of the battery monitoring system 1, battery monitoring IC 10, and control device 6 described in the embodiments above merely constitute one example, and it is possible to make modifications according to the situation within a scope that does not depart from the gist of the present invention.

What is claimed is:

1. A semiconductor device for measuring a voltage of a battery cell, comprising:
    a first node configured to receive a first voltage, the first voltage being a voltage of a capacitor that accumulates an electric charge based on the voltage of the battery cell, the first node connected to a first end of the battery cell;
    a first battery voltage measurement unit configured to measure the first voltage through a first path;
    a second node configured to receive a second voltage based on the voltage of the battery cell, the second node being different from the first node, the second node connected to the first end of the battery cell; and
    a second battery voltage measurement unit configured to measure the second voltage through a second path that is different from the first path.

2. The semiconductor device according to claim 1, wherein the first battery voltage measurement unit and the second battery voltage measurement unit are configured to output measurement results to a comparison unit, which is configured to compare the received measurement results, to thereby diagnose an anomaly in the first or second voltage measurement unit.

3. The semiconductor device according to claim 1,
    wherein the first node includes a high potential side first node and a low potential side first node;
    wherein the capacitor includes a high potential side capacitor and a low potential side capacitor that are respectively connected to the high potential side first node and the low potential side first node;
    wherein the electric charge includes a high potential side electric charge and a low potential side electric charge;
    wherein the first voltage includes a high potential side first voltage and a low potential side first voltage that are respectively received by the high potential side first node and the low potential side first node;
    wherein the high potential side first voltage is a voltage of the high potential side capacitor that accumulates the high potential side electric charge based on a voltage of a high potential side of the battery cell;
    wherein the low potential side first voltage is a voltage of the low potential side capacitor that accumulates the low potential side electric charge based on a voltage of a low potential side of the battery cell;
    wherein the first battery voltage measurement unit includes a first level shifter configured to output a difference between the high potential side first voltage and the low potential side first voltage, and a first conversion unit configured to convert a signal outputted from the level shifter to a first digital signal and to output the first digital signal;
    wherein the second node includes a high potential side second node and a low potential side second node;
    wherein the second voltage includes a high potential side second voltage and a low potential side second voltage, which are respectively received by the high potential side second node and the low potential side second node, and are respectively based on the voltages on the high potential side and the low potential side of the battery cell; and
    wherein the second battery voltage measurement unit includes a second level shifter configured to output a difference between the high potential side second voltage and the low potential node second voltage, and a second conversion unit configured to convert a signal outputted from the second level shifter to a second digital signal and to output the second digital signal.

4. The semiconductor device according to claim 3, wherein
    the second level shifter has a slower operational speed than the first level shifter,
    the second conversion unit has a lower resolution than the first conversion unit, or
    both the second level shifter has a slower operational speed than the first level shifter and the second conversion unit has a lower resolution than the first conversion unit.

5. A semiconductor device for measuring a voltage of a battery cell, comprising:
    a first node configured to receive a first voltage of a first capacitor that accumulates a first electric charge based on the voltage of the battery cell, the first node connected to a first end of the battery cell;
    a second node configured to receive a second voltage based on the voltage of the battery cell, the second node connected to the first end of the battery cell;
    a first diagnostic voltage generating circuit configured to output a first diagnostic voltage;
    a second diagnostic voltage generating circuit configured to output a second diagnostic voltage; and
    a battery voltage measurement unit that measures a voltage of the first node for determining the voltage of the battery cell, and measures the first and second diagnostic voltages for performing a first diagnosis relating to an anomaly in the battery voltage measurement unit.

6. The semiconductor device according to claim 5,
    wherein the first node includes a first high potential node, a second high potential node, and a low potential node,
    wherein the first capacitor includes a first high potential side capacitor, a second high potential side capacitor and a low potential side capacitor that are respectively connected to the first high potential node, the second high potential node, and the low potential node;
    wherein the first electric charge includes a high potential side electric charge, which is accumulated by the first and second high potential nodes, and a low potential side electric charge that is accumulated by the low potential node; and wherein the battery voltage measurement unit measures a difference in voltage between the first high potential node and the low potential node, and a difference in voltage between the second high potential node and the low potential node, for performing a second diagnosis relating to an anomaly in the battery voltage measurement unit.

7. The semiconductor device according to claim 5, wherein the second node is connected to a second capacitor in which a second electric charge based on a voltage of a high potential side of the battery cell accumulates, wherein the semiconductor device further comprises a third node connected to a third capacitor in which a third electric charge based on a voltage of a low potential side of the battery cell accumulates, and wherein the battery voltage measurement unit measures the voltage of the first node and measures a difference in voltage between the second node and the third node for performing a second diagnosis relating to an anomaly in the battery voltage measurement unit.

8. The semiconductor device according to claim 5, wherein the battery voltage measurement unit is configured to output measurement results to a comparison unit, which is configured to compare the received measurement results, and to thereby perform diagnosis relating to the anomaly in the battery voltage measurement unit.

9. A battery monitoring system, comprising:

the semiconductor device according to claim 1; and a diagnostic unit that is configured to compare measurement results of the first battery voltage measurement unit and measurement results of the second battery voltage measurement unit of the semiconductor device, and to perform diagnosis relating to an anomaly in the semiconductor device on the basis of a result of the comparison.

10. A battery monitoring system, comprising:

a plurality of battery cells connected in series;

the semiconductor device according to claim 1 that operates on the basis of a control signal to measure a voltage of each of the plurality of battery cells using the first battery voltage measurement unit;

a diagnostic unit that is configured to compare measurement results of the first battery voltage measurement unit and measurement results of the second battery voltage measurement unit of the semiconductor device, and to perform diagnosis relating to an anomaly in the semiconductor device on the basis of a result of the comparison; and a control device that is configured to output the control signal to the semiconductor device.

11. A method for diagnosing an anomaly in a semiconductor device, the semiconductor device monitoring a voltage of a battery cell, the method comprising:

providing a first node that receives a first voltage, the first voltage being a voltage of a capacitor that accumulates an electric charge based on the voltage of the battery cell, the first node connected to a first end of the battery cell;

measuring, through a first path, a voltage of the first node using a first battery voltage measurement unit;

providing a second node that receives a second voltage based on the voltage of the battery cell, the second node being different from the first node, the second node connected to the first end of the battery cell;

measuring, through a second path differing from the first path, a voltage of the second node using a second battery voltage measurement unit; and performing, using a diagnostic unit, diagnosis using comparison results between measurement results of the first battery voltage measurement unit and measurement results of the second battery voltage measurement unit.

* * * * *